United States Patent
Brockman et al.

(10) Patent No.: US 10,429,431 B2
(45) Date of Patent: Oct. 1, 2019

(54) CODELESS RECEPTACLE TESTER

(71) Applicant: Power Products, LLC, Menomonee Falls, WI (US)

(72) Inventors: Daryl C. Brockman, Monroe, WI (US); Patrick J. Radle, Mequon, WI (US)

(73) Assignee: ECM Industries, New Berlin, WI (US)

( * ) Notice: Subject to any disclaimer, the term of this patent is extended or adjusted under 35 U.S.C. 154(b) by 0 days.

(21) Appl. No.: 15/147,688

(22) Filed: May 5, 2016

(65) Prior Publication Data

US 2016/0327601 A1 Nov. 10, 2016

Related U.S. Application Data

(60) Provisional application No. 62/157,226, filed on May 5, 2015.

(51) Int. Cl.
*G01R 31/04* (2006.01)
*G01R 31/02* (2006.01)
*G01R 1/067* (2006.01)

(52) U.S. Cl.
CPC ........ *G01R 31/041* (2013.01); *G01R 1/06788* (2013.01); *G01R 31/024* (2013.01); *G01R 31/025* (2013.01)

(58) Field of Classification Search
CPC ................ G01R 31/041; G01R 31/024; G01R 1/06788; G01R 31/025
See application file for complete search history.

(56) References Cited

U.S. PATENT DOCUMENTS

| | | | |
|---|---|---|---|
| 5,103,165 A | 4/1992 | Sirattz | |
| 5,518,411 A | 5/1996 | Belleci | |
| 5,642,052 A | 6/1997 | Earle | |
| 5,877,618 A | 3/1999 | Luebke et al. | |
| 5,900,804 A | 5/1999 | Yewell | |
| 6,072,317 A * | 6/2000 | Mackenzie | H02H 1/0015 |
| | | | 324/508 |
| 6,231,358 B1 | 5/2001 | Kerr, Jr. et al. | |
| 6,724,589 B1 * | 4/2004 | Funderburk | C23F 13/04 |
| | | | 361/42 |
| 6,812,685 B2 | 11/2004 | Steber et al. | |
| 6,828,767 B2 | 12/2004 | Douglas | |

(Continued)

OTHER PUBLICATIONS

Sperry Instruments, Single LED Indicator Stop Shock II GFCI Outlet Circuit Analyzer Tester, Detects Low Resistance, Sep. 9, 2015.

(Continued)

*Primary Examiner* — Akm Zakaria
(74) *Attorney, Agent, or Firm* — Michael Best & Friedrich LLP

(57) ABSTRACT

A codeless receptacle tester including outlet tester circuitry, a housing, and an indicator section. The outlet tester circuitry is configured to perform a plurality of electrical outlet testing functions. The housing has a first end, a second end opposite the first end, and an enclosure that encloses the outlet tester circuitry. The indicator section is electrically connected to the outlet tester circuitry and has a plurality of indicators. Each indicator of the plurality of indicators is configured to provide a codeless indication of an associated wiring condition of an electrical outlet.

18 Claims, 69 Drawing Sheets

(56) References Cited

U.S. PATENT DOCUMENTS

| | | | |
|---|---|---|---|
| 7,184,899 B2 | 2/2007 | Cruz | |
| 7,208,932 B1 | 4/2007 | Chun | |
| 7,259,567 B2 | 8/2007 | Sears et al. | |
| 7,633,282 B2 | 12/2009 | Radle et al. | |
| 7,944,212 B2 | 5/2011 | Radle et al. | |
| 7,994,795 B2 | 8/2011 | Drake et al. | |
| D661,605 S | 6/2012 | Laurino et al. | |
| 8,248,058 B2 | 8/2012 | Stair et al. | |
| 8,866,485 B1 | 10/2014 | Lacey et al. | |
| 9,116,178 B1 | 8/2015 | Czarnecki | |
| 2002/0057089 A1 | 5/2002 | Brown | |
| 2004/0174173 A1* | 9/2004 | Elms | G01R 31/041 324/509 |
| 2005/0275409 A1* | 12/2005 | Mason | G01R 31/045 324/508 |
| 2006/0043959 A1 | 3/2006 | Cavoretto | |
| 2006/0132143 A1* | 6/2006 | Sears | G01R 31/045 324/508 |
| 2008/0042657 A1 | 2/2008 | Radle et al. | |
| 2009/0045817 A1* | 2/2009 | Savicki, Jr. | H01R 25/003 324/508 |
| 2009/0084572 A1 | 4/2009 | Smith | |
| 2009/0189597 A1 | 7/2009 | Lagerberg et al. | |
| 2010/0039279 A1 | 2/2010 | Luebke et al. | |
| 2010/0097733 A1* | 4/2010 | E. | H02H 1/0015 361/42 |
| 2014/0266287 A1 | 9/2014 | Reeder, III | |
| 2016/0064850 A1 | 3/2016 | Draper, Jr. et al. | |

OTHER PUBLICATIONS

Sperry Instruments, DualCheck 2-in-1 Tester, 50-1000V AC Non-Contact Voltage Detector, GFCI Outlet Circuit Analyzer, Sep. 9, 2015.

Office Action from the US Patent and Trademark Office for U.S. Appl. No. 15/147,696 dated Sep. 8, 2017 (15 pages).

Final Office Action from the U.S. Patent and Trademark Office for U.S. Appl. No. 15/147,696 dated Feb. 6, 2018 (20 pages).

* cited by examiner

| NO. | ITEM | DESCRIPTION | REMARK | Q'TY |
|---|---|---|---|---|
| 1 | FUSE | UL SGP 1.0A/250V 5*20MM | FUSE | 1 |
| 2 | RESISTOR | 15K(1206,±5%) | R1 | 1 |
| 3 | RESISTOR | 18K(1206,±5%) | R20 | 1 |
| 4 | E.CAP | 10µF/35V | C4 | 1 |
| 5 | LED | GREEN LED | LED1 | 1 |
| 6 | LED | RED LED | LED2/3/4/5 | 4 |
| 7 | RESISTOR | 120K(0805,±5%) | R4 | 1 |
| 8 | RESISTOR | 10K(0805,±5%) | R7 | 1 |
| 9 | RESISTOR | 220K(0805,±5%) | R9 | 1 |
| 10 | RESISTOR | 1K(0805,±5%) | R14 R15 R16 R17 R18 | 5 |
| 11 | RESISTOR | 12K(0805,±5%) | R2 R3 R6 | 3 |
| 12 | RESISTOR | 100K(0805,±5%) | R5 R8 | 2 |
| 13 | RESISTOR | 10M(0805,±5%) | R10 R11 R12 | 3 |
| 14 | CAP | 104/63V/0805 | C1 C2 C5 | 3 |
| 15 | DIODE | 1N4148 | D6 D8 D9 | 3 |
| 16 | ZENER | 11V | Z3 Z4 | 2 |
| 17 | ZENER | 9V | Z1 Z2 | 2 |
| 18 | DIODE | 1N4007 | D1 D2 D3 D4 D5 D7 | 6 |
| 19 | IC | 4051BP | U1 | 1 |
| 20 | WIRE | 24AWG UL 1015 | SW | 2 |
| 21 | WIRE | 18AWG UL 1015 | H G N | 3 |
| 22 | PCB | FR-4 | PCB | 1 |
| 23 | HOUSING | ABS 765B | | 1 |
| 24 | LENS | PC 940 | | 1 |
| 25 | BOTTOM | ABS 765B | | 1 |

FIG. 12B

CODELESS RECEPTACLE TESTER

CROSS-REFERENCE TO RELATED APPLICATION

This application claims the benefit of U.S. Provisional Patent Application No. 62/157,226, filed on May 5, 2015, the entire content of which is hereby incorporated by reference.

FIELD

The present invention relates to an electrical test device.

BACKGROUND

Receptacle testers are used to verify the correct wiring of a wall outlet. A receptacle tester can be used to determine whether or not an outlet is functioning (i.e., would provide power and an appropriate voltage to an attached device for operation) and/or whether the wiring is safe (i.e., whether improper wiring could result in damage to the device or create a situation in which a person may receive an electrical shock).

Conventional receptacle testers, such as the receptacle tester 10 shown in FIG. 1, have a body 12 and a plug 14 that extends from the body 12. The plug 14 includes three prongs (one for hot contact, one for neutral contact, and one for ground contact). The receptacle tester 10 also has three indicators 16 and a code label 18 located on the body 12. Optionally, a ground fault circuit interrupter tester operated by a button 20 may be available on the receptacle tester 10.

SUMMARY

When the plug 14 of the receptacle tester 10 is plugged into a live outlet, one or more of the indicators 16 may light up to indicate the wiring status of the outlet. A user then compares the on/off status of each of the three indicators 16 to a code label 18, which has a list of the wiring states for each of the indicator combinations, to determine whether or not the outlet is correctly wired. If the outlet is not correctly wired, then comparison of the indicator 16 to the code label 18 can be used to determine which of the wires are incorrectly connected to the outlet.

However, under certain conditions, it can be difficult for the user to read the code label. Because receptacle testers are generally quite small, the text printed on the code label must also be small and is often difficult to read. Further complicating reading of the code label is that, because at least the outlet being tested is not connected to a light source, it is likely that the receptacle tester is being used in a poorly lit area. Additionally, not all outlets are oriented in an upright position (i.e., two flat prongs on top, one ground prong on bottom). Upon insertion of the receptacle tester into an upside-down outlet, it may be difficult for the user to consult the code label or see the indicators. Thus, testing an outlet having a non-standard orientation can be difficult using a standard receptacle tester.

Hence, there is a need for an improved receptacle tester that may provide easy analysis of the output provided by the receptacle tester and can be used on outlets having various orientations.

In one independent aspect, a receptacle tester may generally include a housing supporting a circuit including a controller and a number of indicators (e.g., light-emitting diodes (LEDs)) electrically connected to the controller, each indicator being representative of a condition of wiring of an outlet to be tested, each indicator being visible from at least two opposite sides of the housing.

In another independent aspect, a receptacle tester for testing a wiring state of an electrical outlet having a single hot terminal, a single neutral terminal and a single ground terminal may be provided. The tester may generally include a housing having five light indicators, a separate one of said light indicators being for indicating each of the conditions; (a) correct; (b) bad ground; (c) open neutral; (d) hot and ground reversed; and (e) hot and neutral reversed; and wherein an absence of any indicator being lit indicates an open hot condition. The light indicators may be on each of two opposed surfaces of the housing. Each indicator may include a light pipe that conducts light from an LED to the two surfaces. The light indicators may be on a side surface of the housing and may be visible from a front side of the housing and from a rear side of the housing.

Independent features and independent advantages of the invention will become apparent to those skilled in the art upon review of the detailed description, drawings and claims.

BRIEF DESCRIPTION OF THE DRAWINGS

FIGS. 12A-12B are a circuit diagram and a parts listing for a receptacle tester of the invention.

DETAILED DESCRIPTION

Before any independent embodiments of the invention are explained in detail, it is to be understood that the invention is not limited in its application to the details of construction and the arrangement of components set forth in the following description or illustrated in the following drawings. The invention is capable of other independent embodiments and of being practiced or of being carried out in various ways.

Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof.

Figure 1:
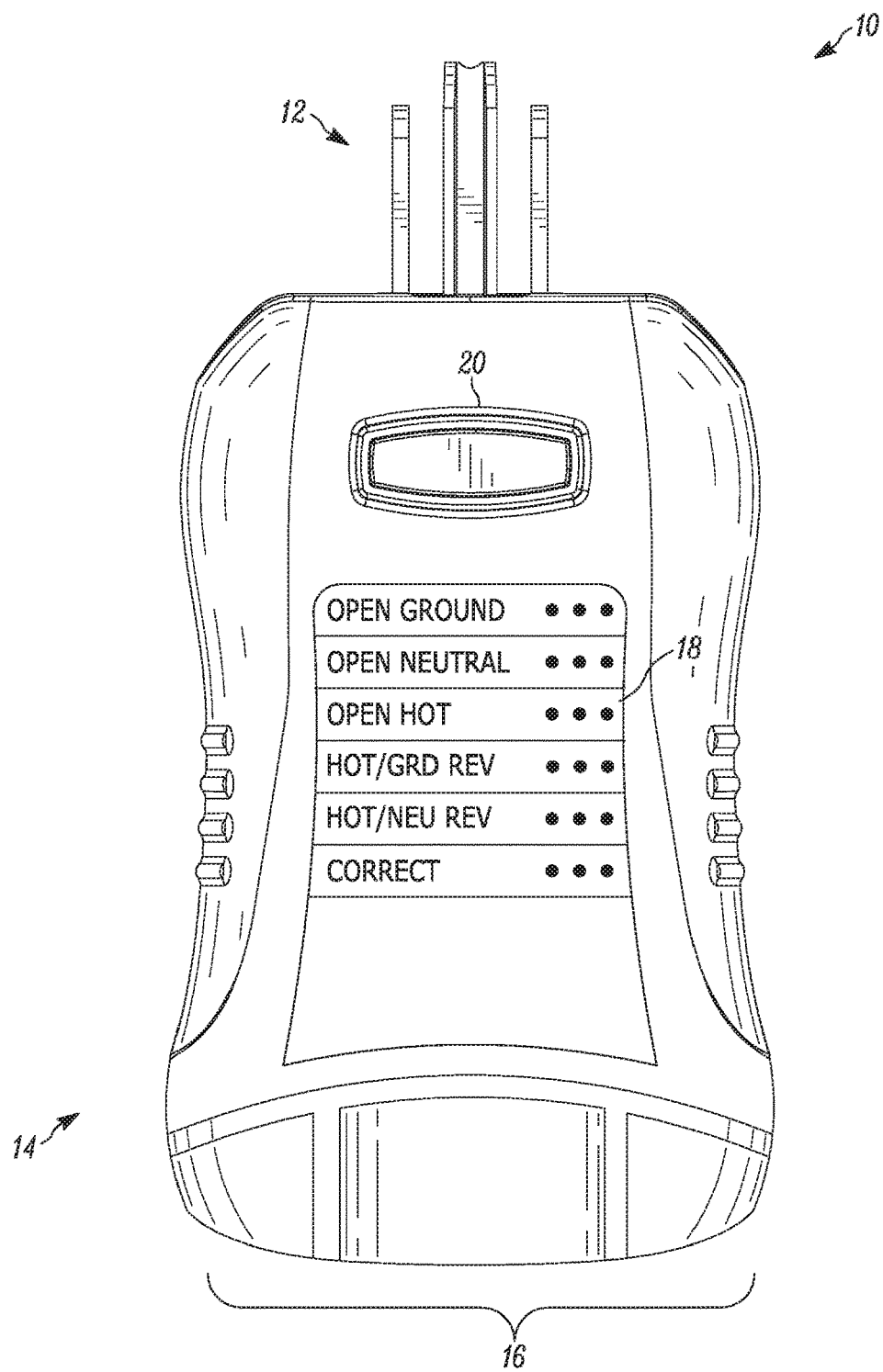
FIG. 1 is a top view of a prior art receptacle tester.
Figure 2:
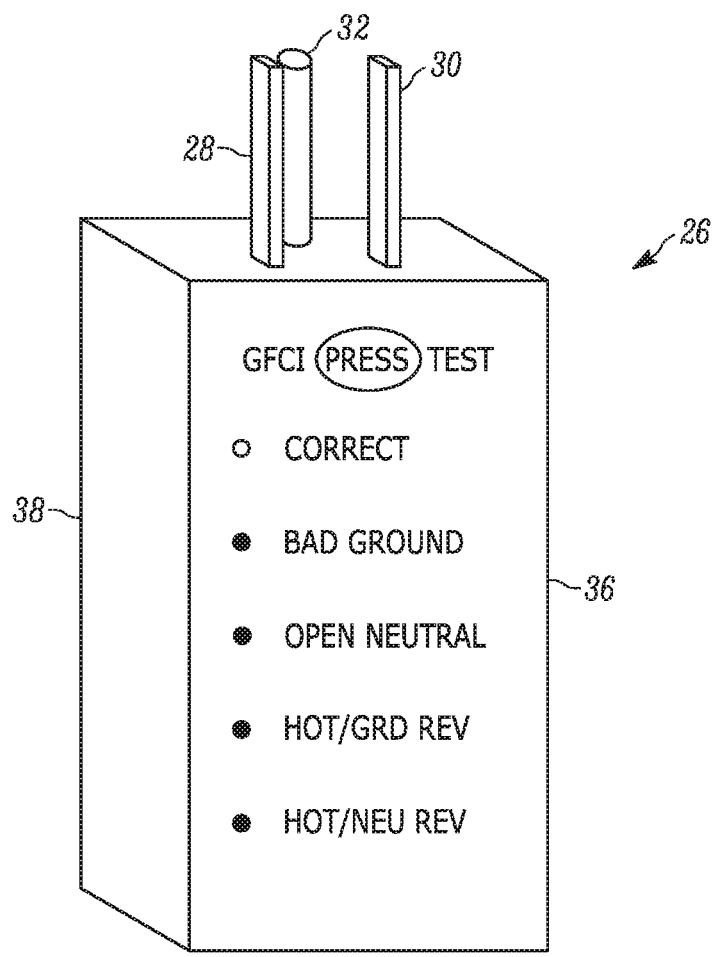
FIG. 2 is a perspective view of a receptacle tester of the invention.
Figure 3:
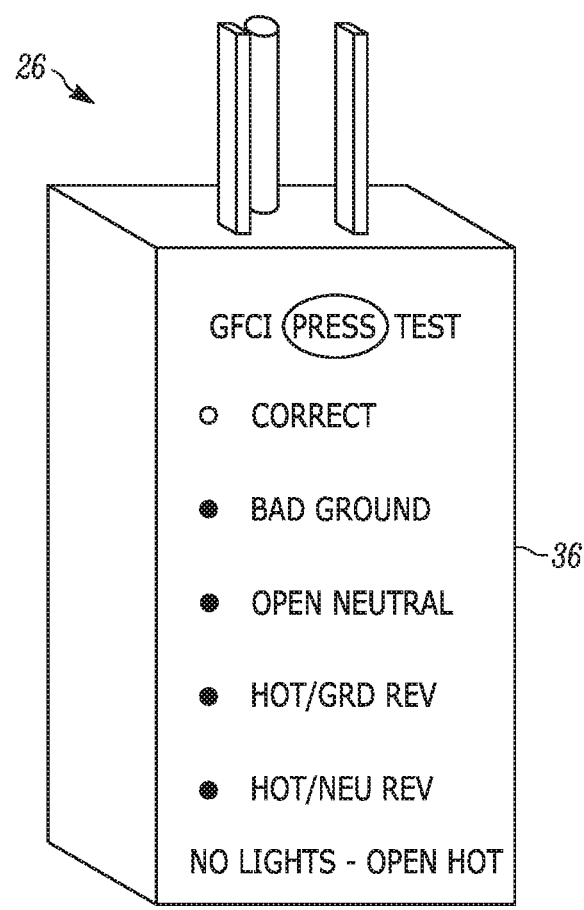
FIG. 3 is a view like FIG. 2 of the front of the tester.
Figure 4:
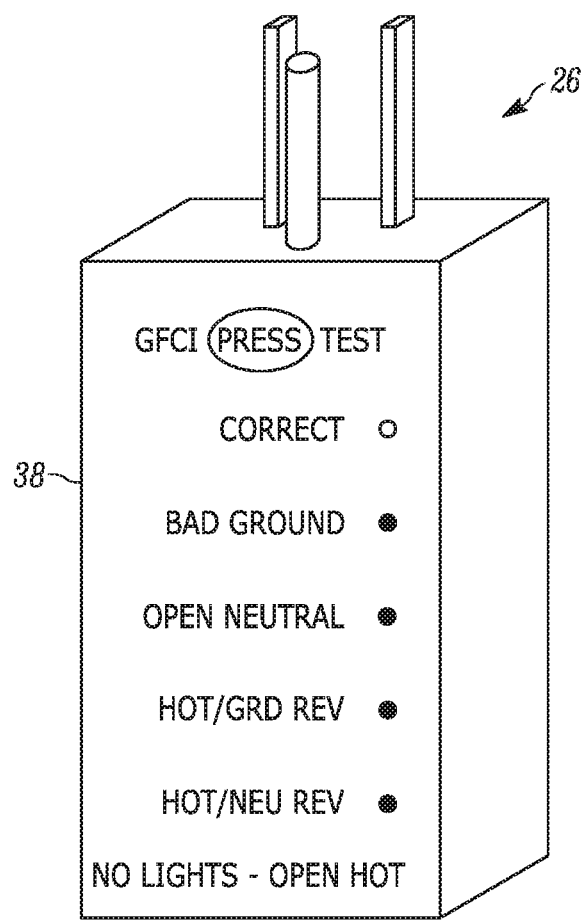
FIG. 4 is a view of the tester of FIG. 3 but of the back of the tester, illustrating that the tester has indicators on both the front and rear sides.
Figure 5:
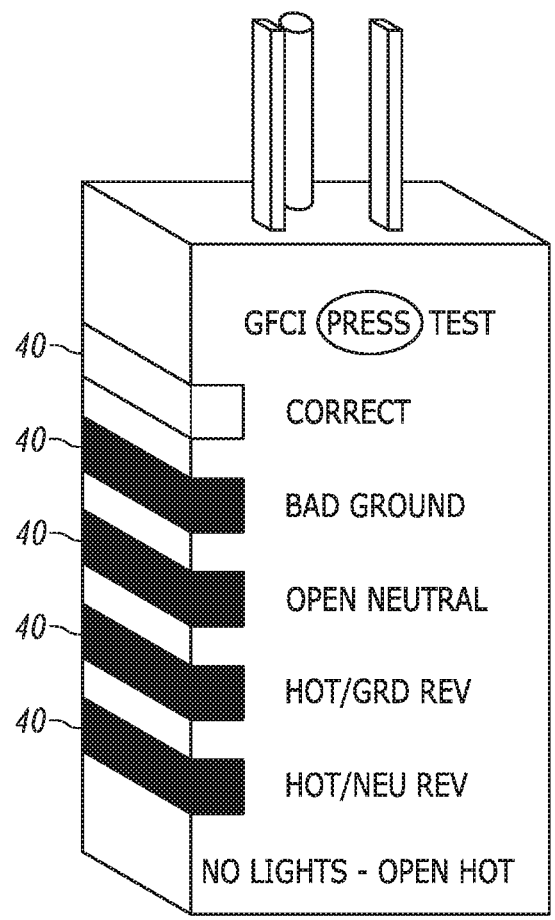
FIG. 5 is a perspective view of a second embodiment of a tester from the front.
Figure 6:
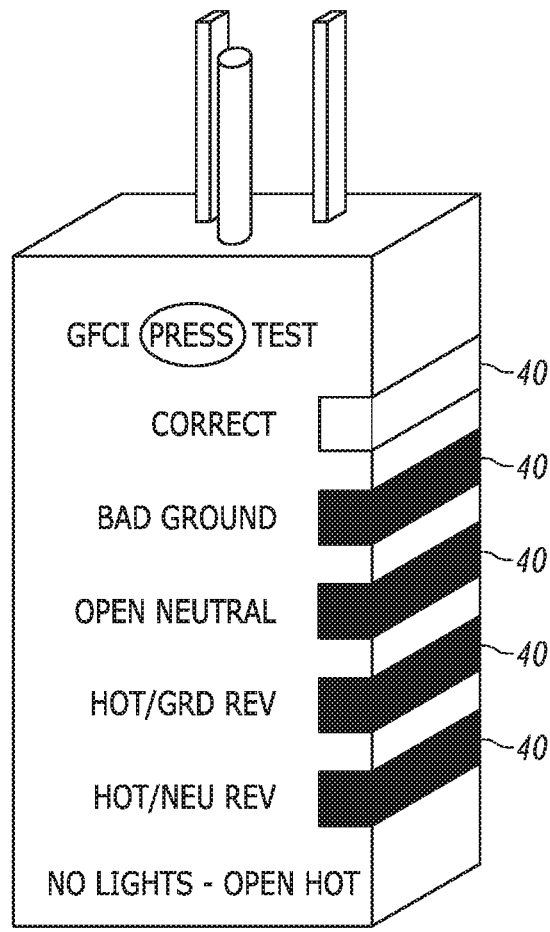
FIG. 6 is a perspective view of the tester of FIG. 5 but from the rear.
Figure 7:
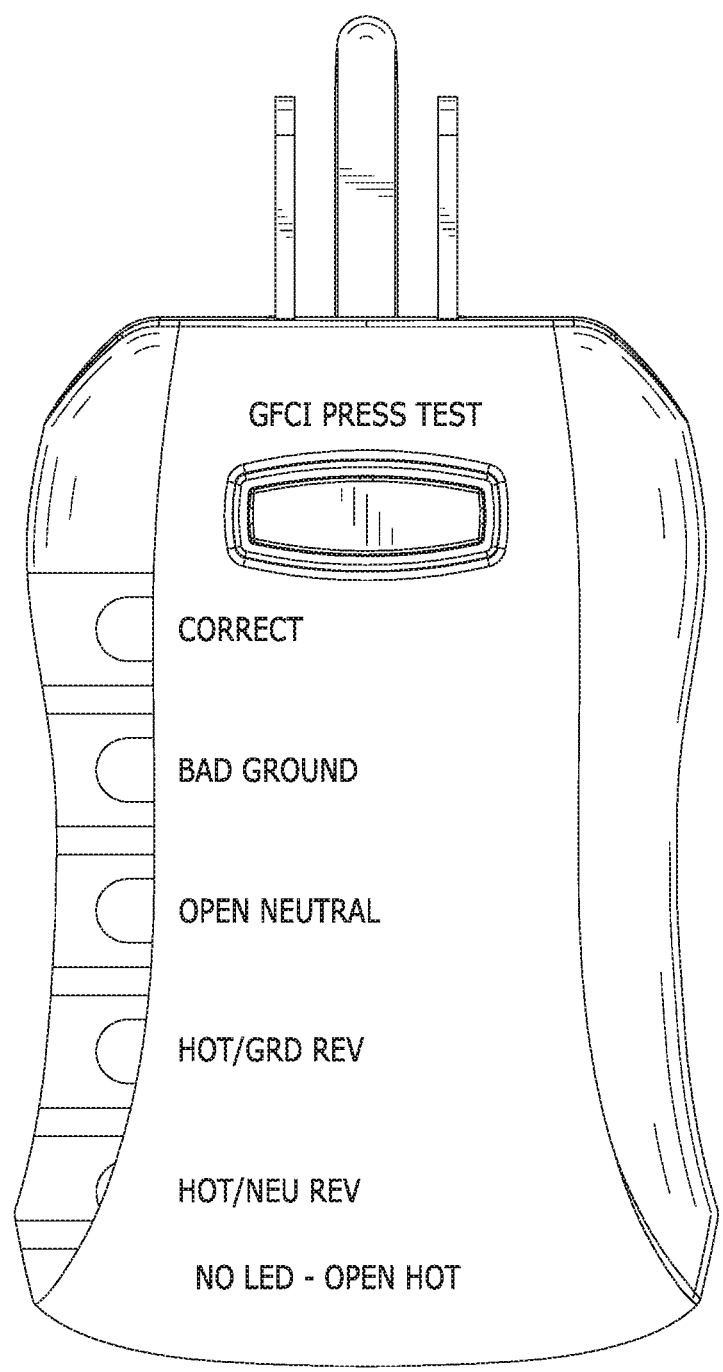
FIG. 7 is a front plan view of a third embodiment of a tester.
Figure 8:
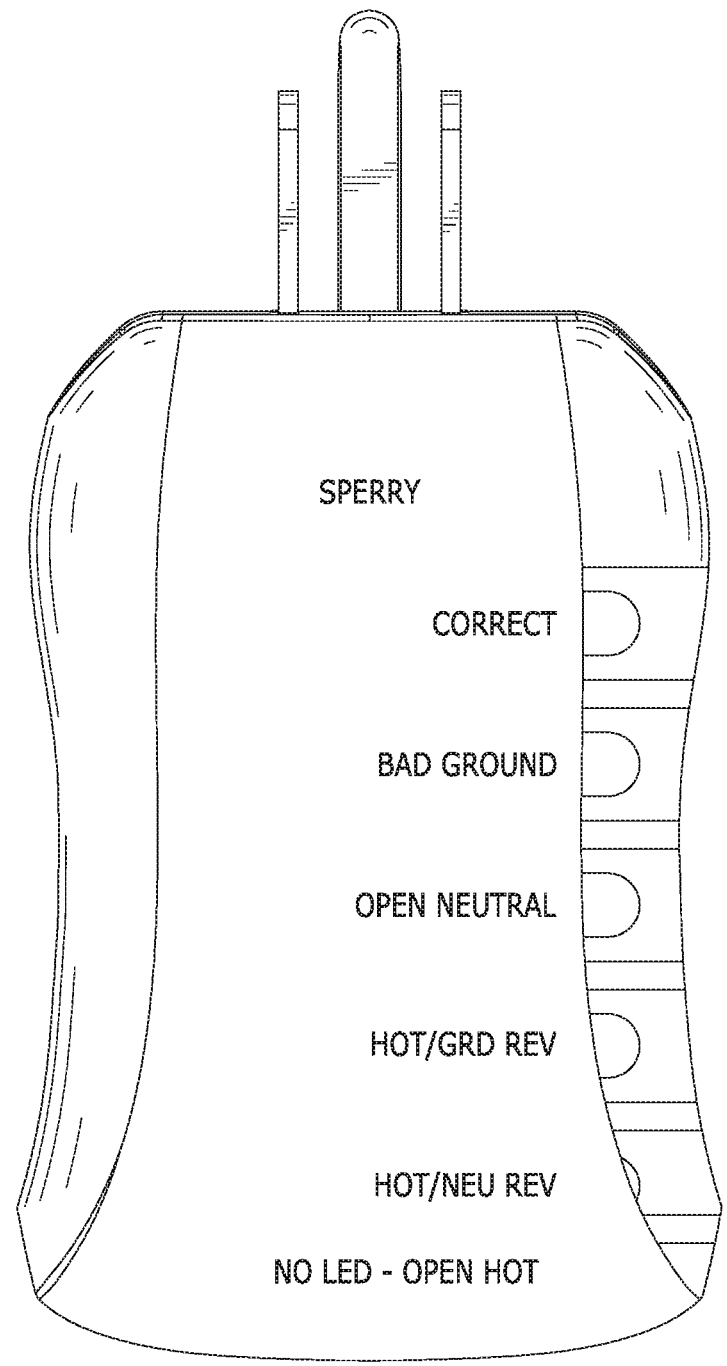
FIG. 8 is a rear plan view of the tester of FIG. 7.
Figure 9:
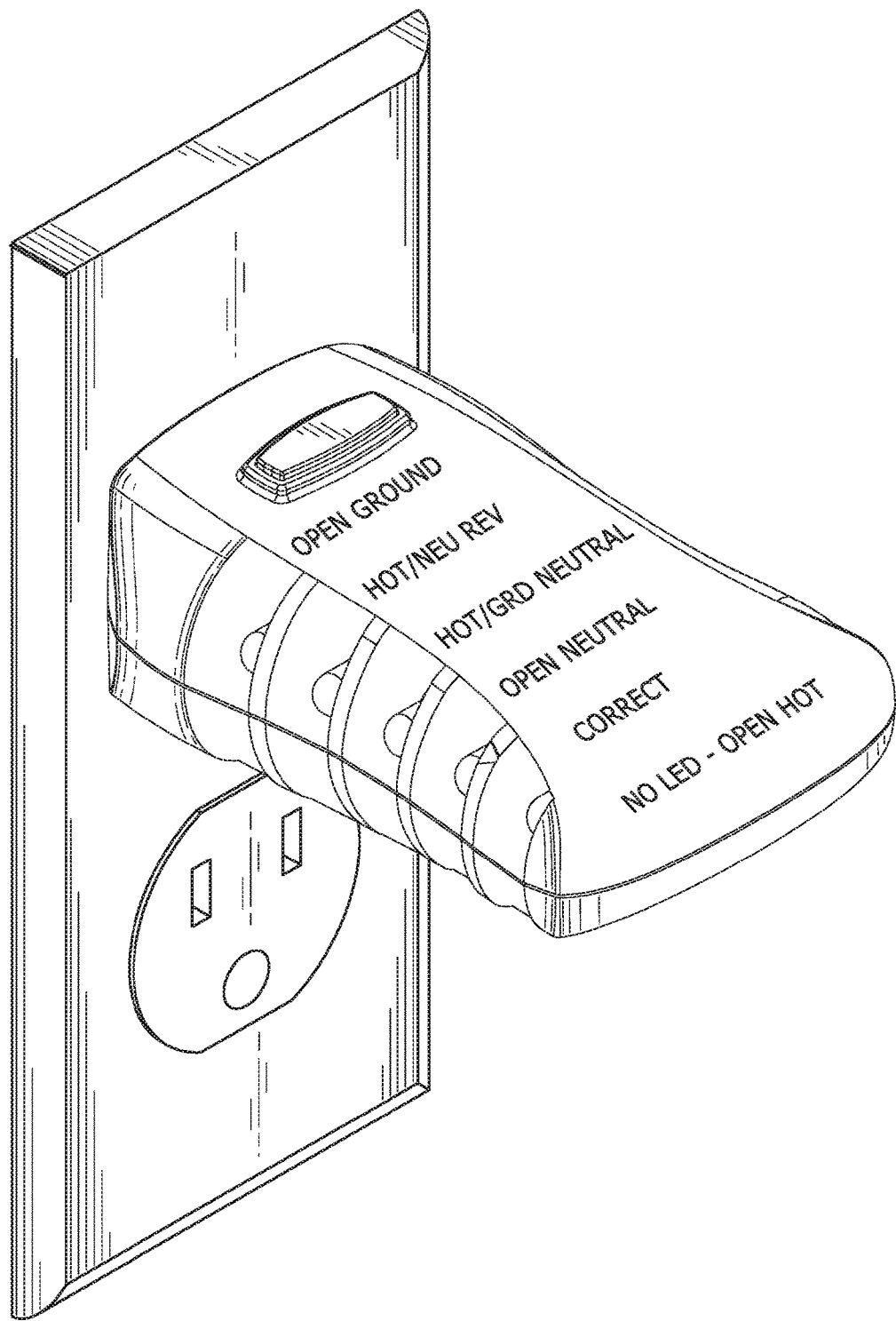
FIG. 9 is a perspective view of a fourth embodiment of a tester plugged into a wall outlet.
Figure 10:
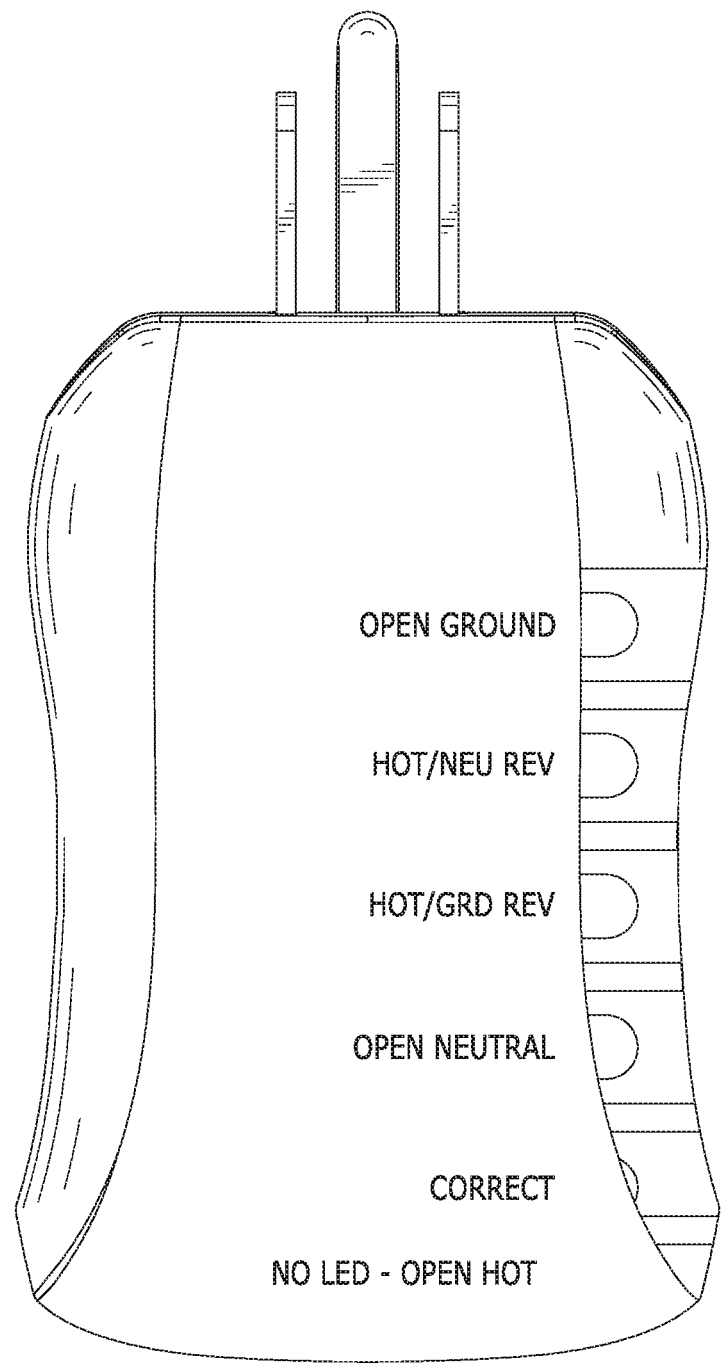
FIG. 10 is a bottom plan view of the embodiment of FIG. 9.
Figure 11:
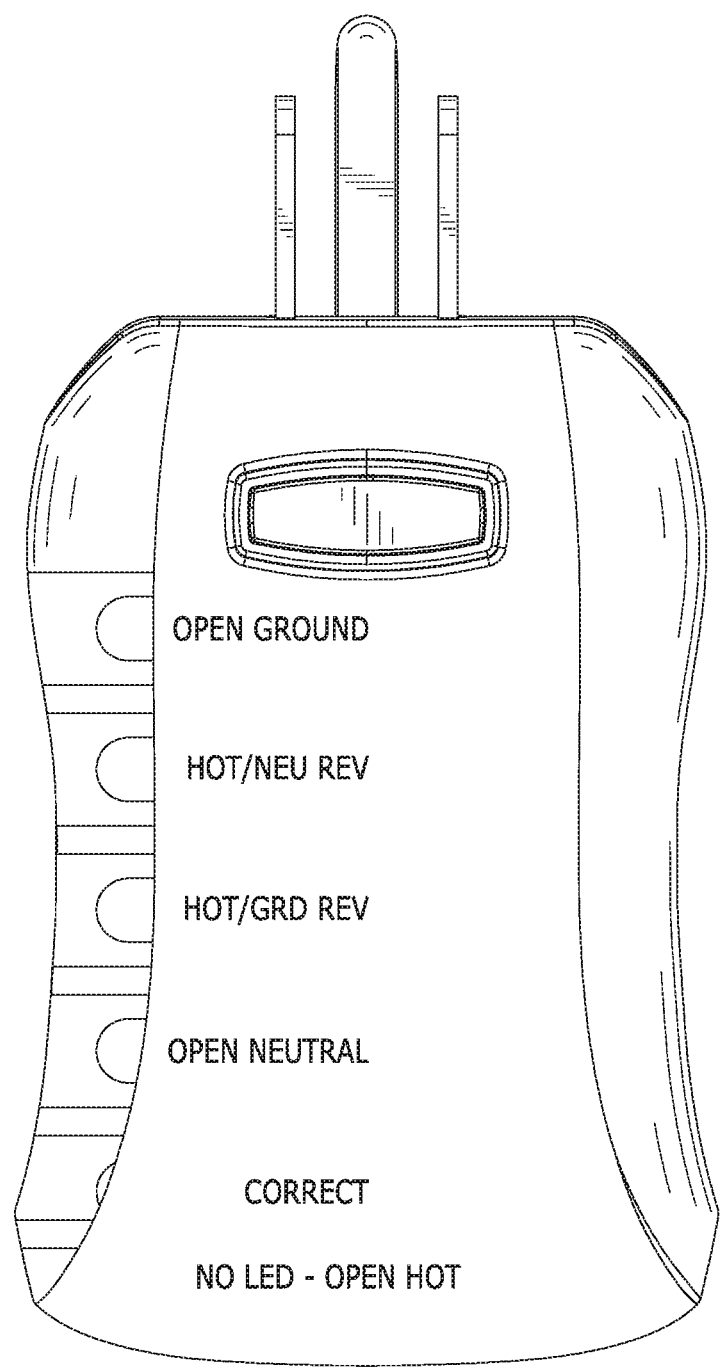
FIG. 11 is a top plan view of the embodiment of FIG. 10.

FIGS. 2-4 illustrate a first embodiment which is presented as a GFCI receptacle tester 26 for a 110-125VAC standard residential electrical outlet in the United States. Independent aspects of the invention may be incorporated in a GFCI receptacle tester or a receptacle tester that is not capable of testing a GFCI.

The tester 26 has a standard plug with two flat blades 28 and 30 and a round prong 32. One of the two flat blades 28, 30 is hot, the other is neutral and the round prong 32 is ground. The round prong 32 is connected to the neutral one of the blades 28 and 30 back at the electrical service box of the building, where all of the electrical circuits of the building come together and are connected to the line voltage coming from the power company through circuit breakers of fuses.

In the illustrated construction, there are six possible conditions of the 110-125VAC electrical outlet into which the tester 26 is plugged as follows: Correct, meaning that the ground, neutral and hot wires inside the outlet are connected to the correct terminals of the outlet; Bad ground, meaning that continuity is lacking between the ground terminal of the outlet and the ground of the electrical service; Open neutral, meaning that continuity is lacking between the neutral terminal of the outlet and the ground of the electrical service; Hot/Grd rev, meaning that the hot and ground wires of the service are improperly connect to the ground and hot terminals of the outlet, respectively; Hot/Neu rev, meaning that the hot and neutral wires of the service are improperly connected to the neutral and hot terminals of the outlet, respectively; and No lights lit, meaning that there is no power to the tester 26, indicating that the hot wire of the service is not connected properly to the outlet.

The tester 26 indicates each of these six conditions without relying on any code as in the prior art. Instead, there is a separate light for each of the first five conditions, and for the sixth—open hot—no lights are lit when the tester is plugged into an outlet to indicate that condition.

In the embodiment of FIGS. 2-4, lights and suitable labels are provided on each of the front 36 and rear 38 sides of the tester 26. This can be done in any of a number of ways. One way is to provide an LED on the circuit board that is contained inside the housing of the tester 26 and provide a light pipe for each LED that extends on either side of the LED to the front and rear sides of the tester. The light pipes may be in two pieces and conduct the light to the two sides simultaneously, so that regardless of what orientation the outlet is installed in, the light indicator will be visible from above the tester 26.

Alternatively, in the embodiments of FIGS. 5-11, LEDs and corresponding lenses 40, possibly of different colors, are provided extending along the side of the tester from the front surface to the rear surface, and have end portions that are visible from the front and rear. The lenses therefore are visible from the front, the rear and the side of the tester, so the indication is visible regardless of what orientation the outlet is installed. The labels that indicate the condition next to each lens are preferably provided on both sides of the tester, as shown in the figures.

Figure 12A:
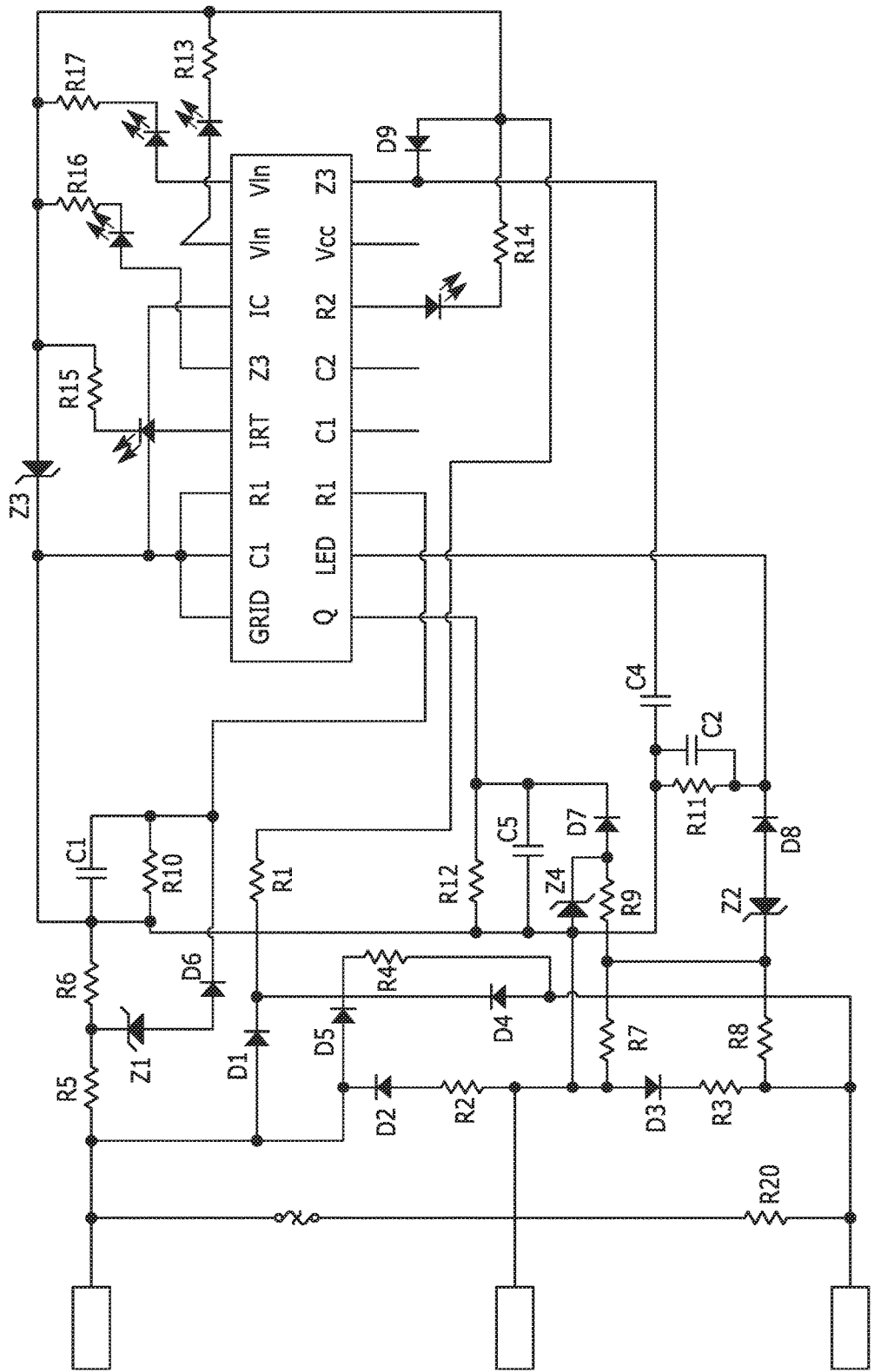
Figure 13:
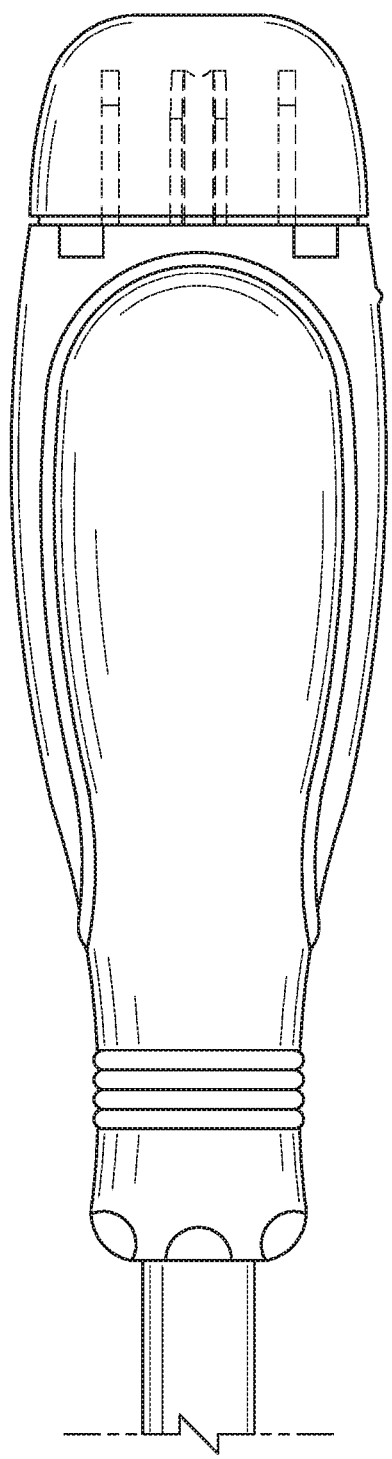
FIGS. 13-46 show additional alternative embodiments of the invention.
Figure 14:
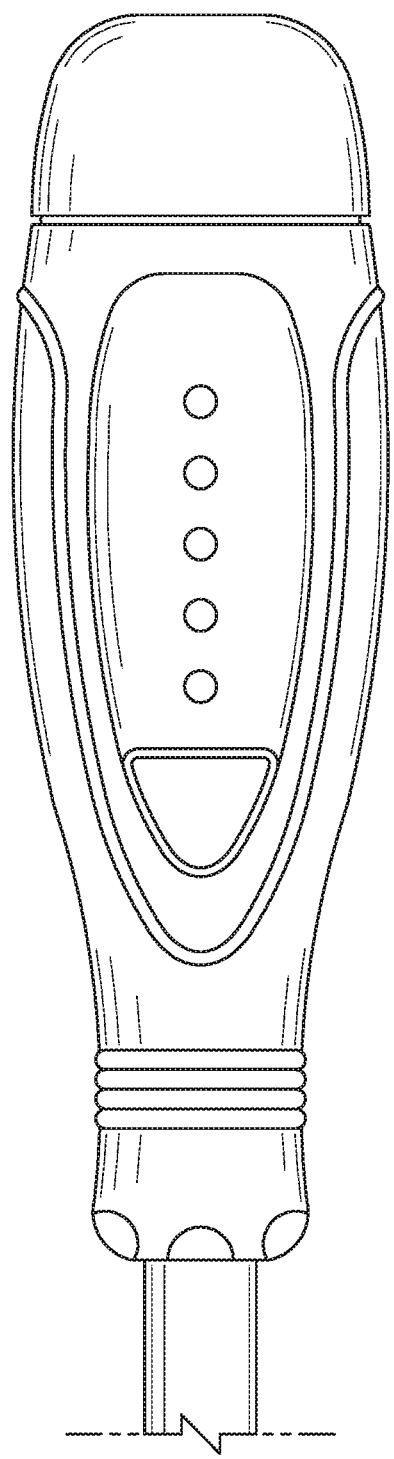
Figure 15:
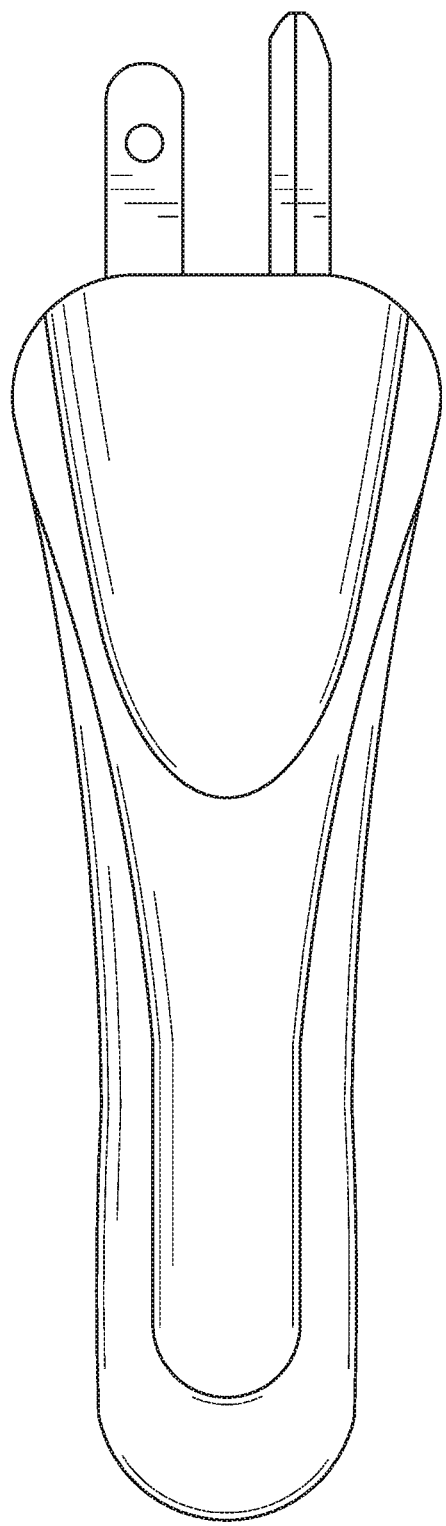
Figure 16:
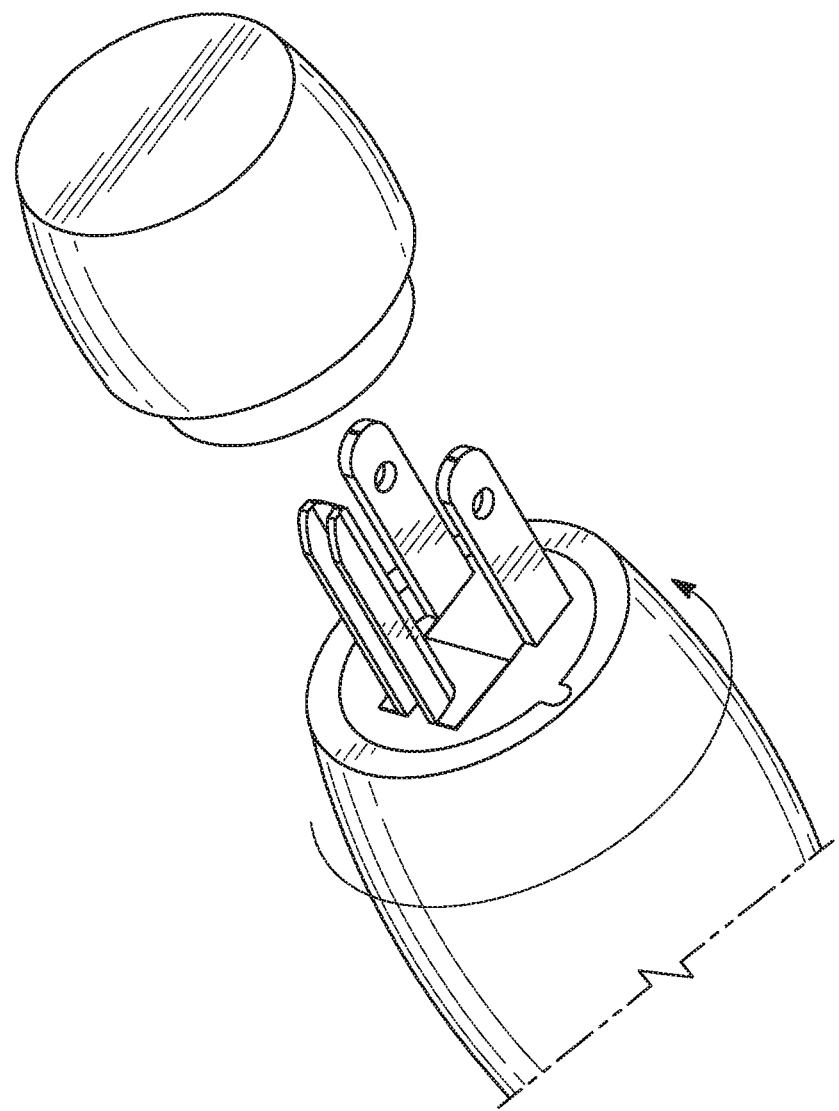

FIG. 12A is an example of a circuit that could be used to practice any of the embodiments described and illustrated herein. Other circuits would also be acceptable. FIG. 12B describes the electrical devices used in the circuit of FIG. 12A.

Figure 17:
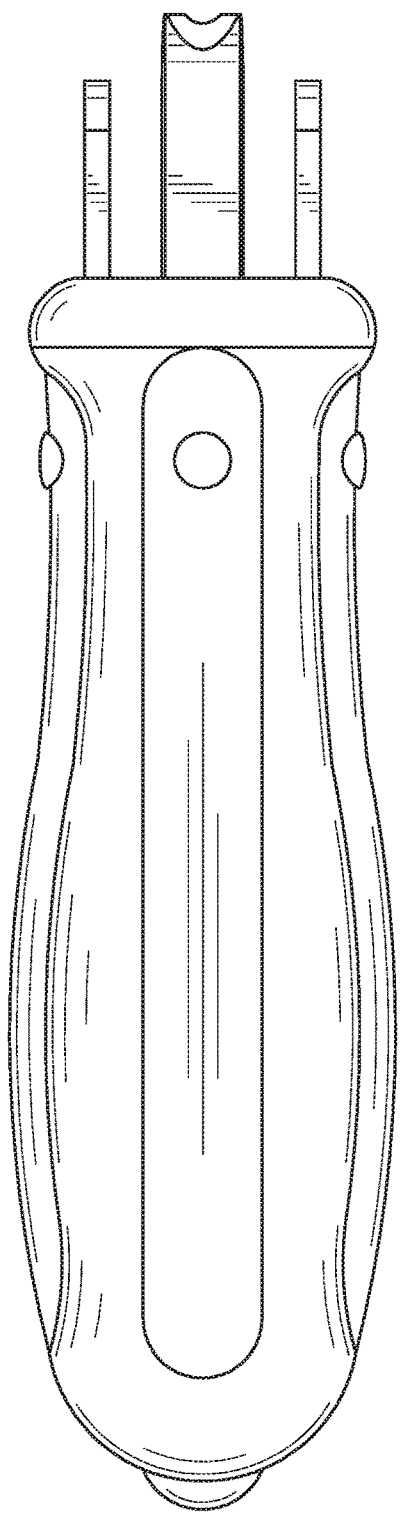
Figure 18:
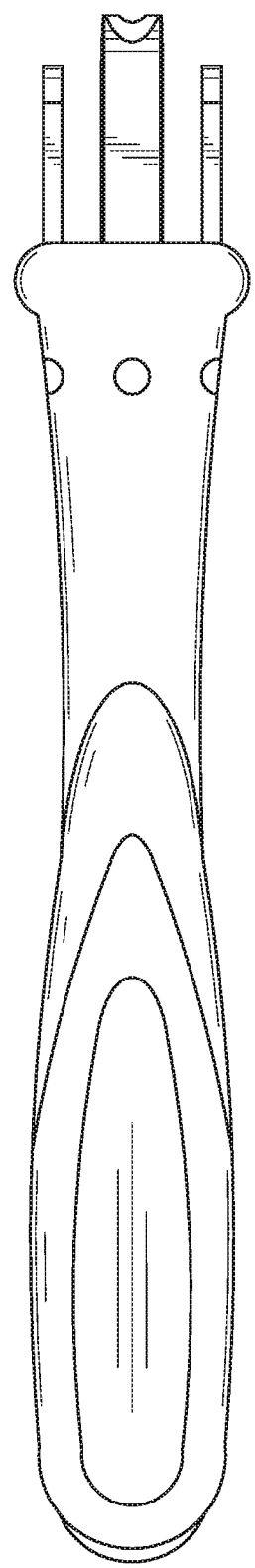
Figure 19:
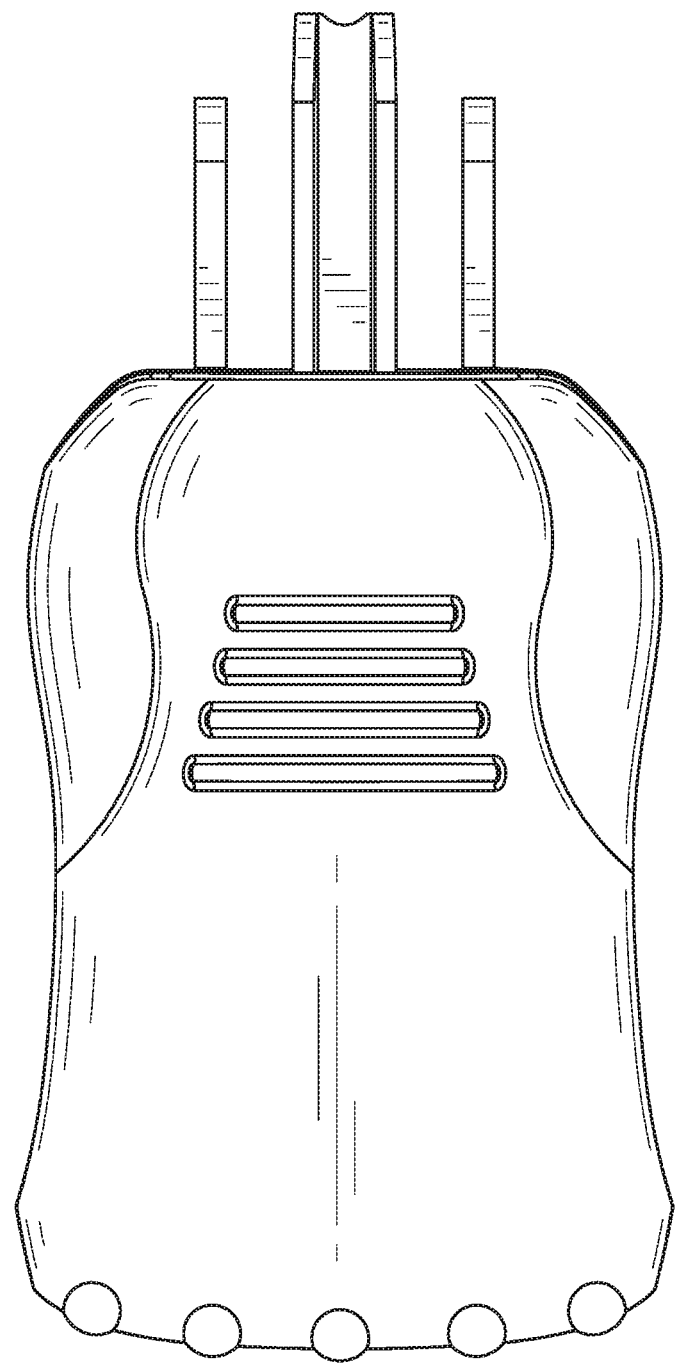
Figure 20:
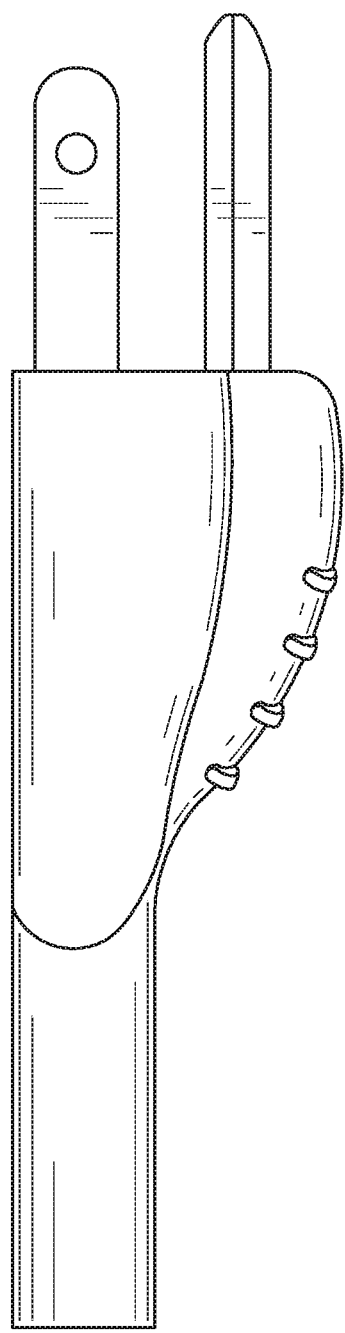
Figure 21:
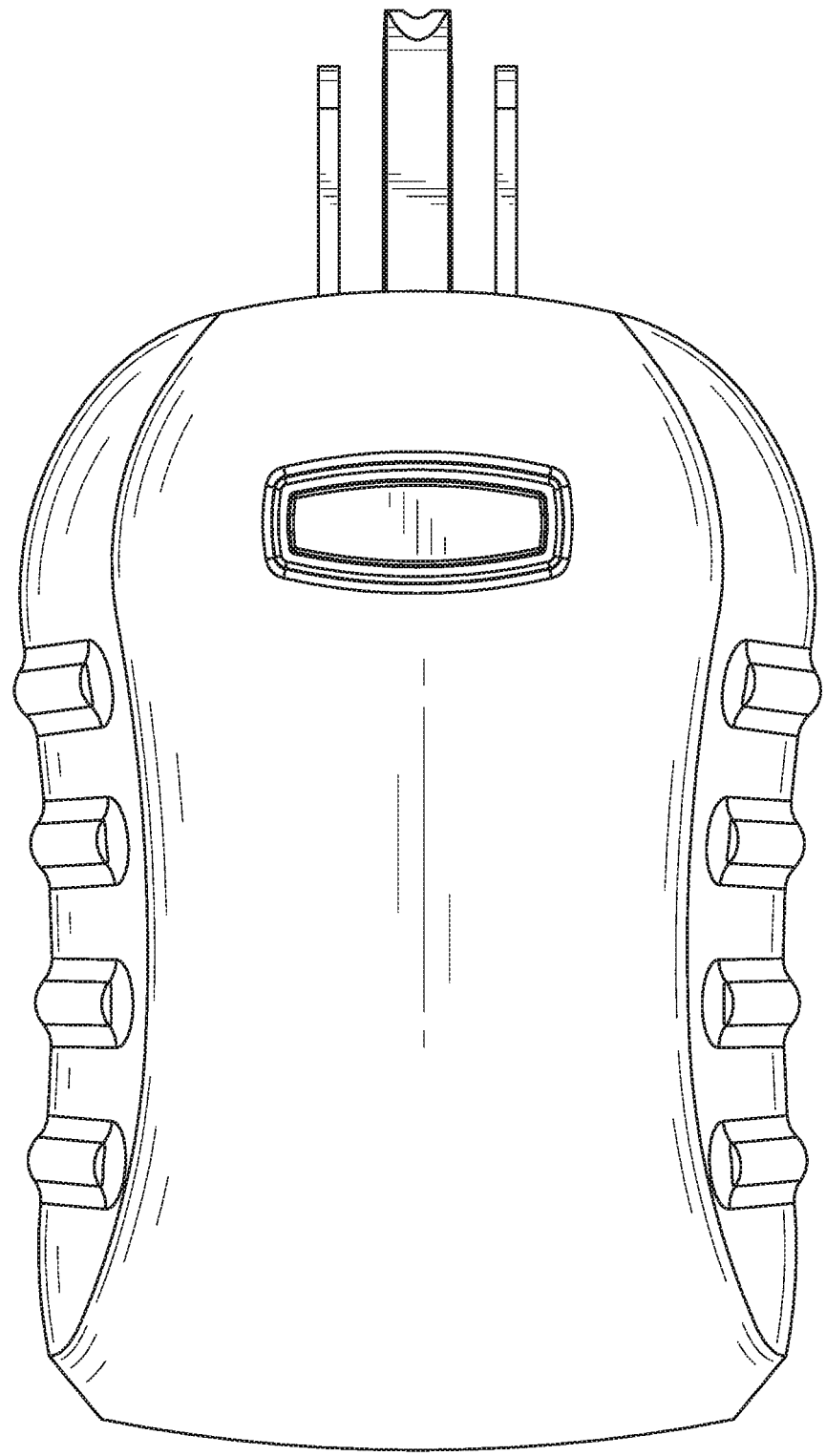
Figure 22:
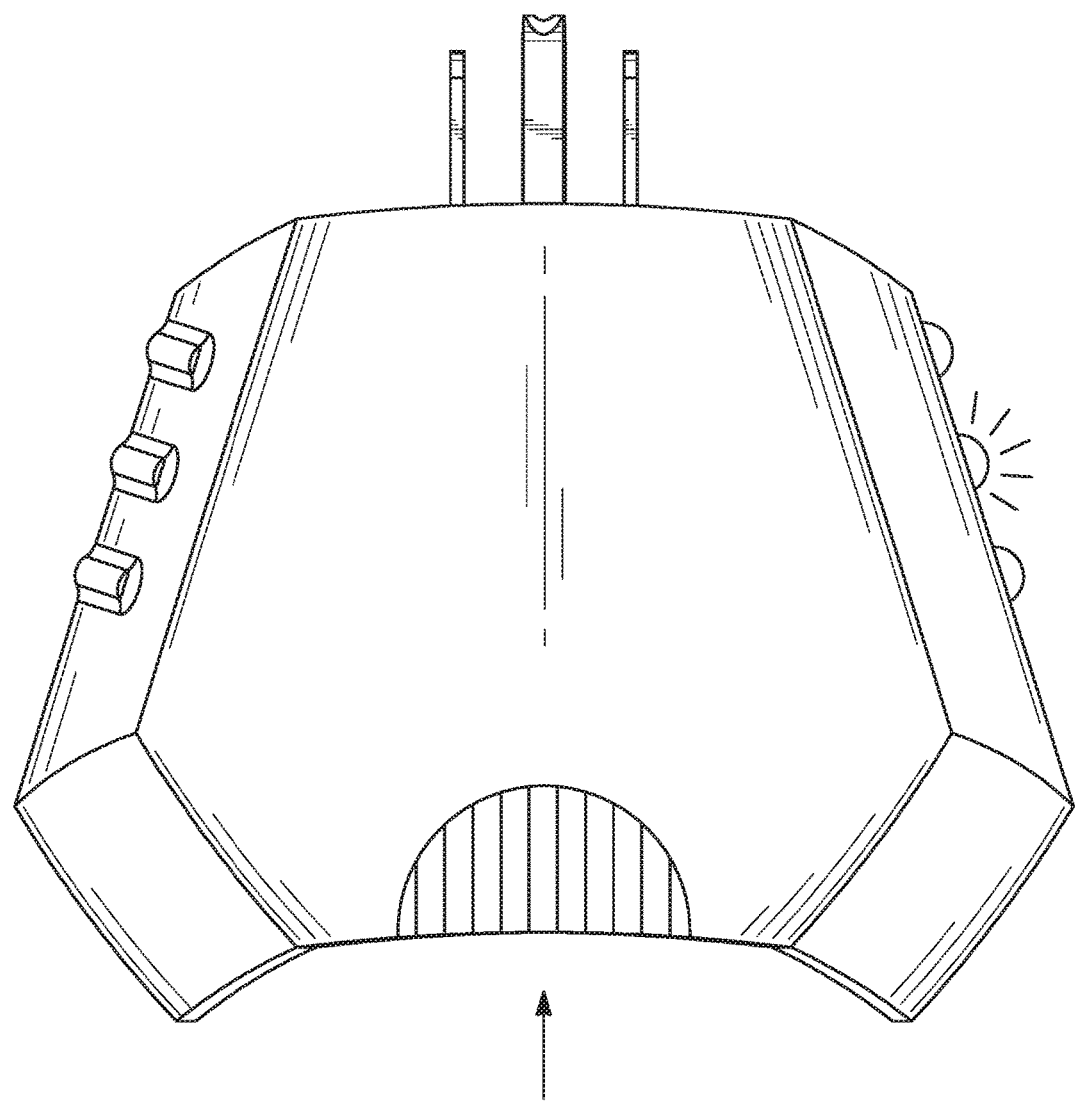
Figure 23:
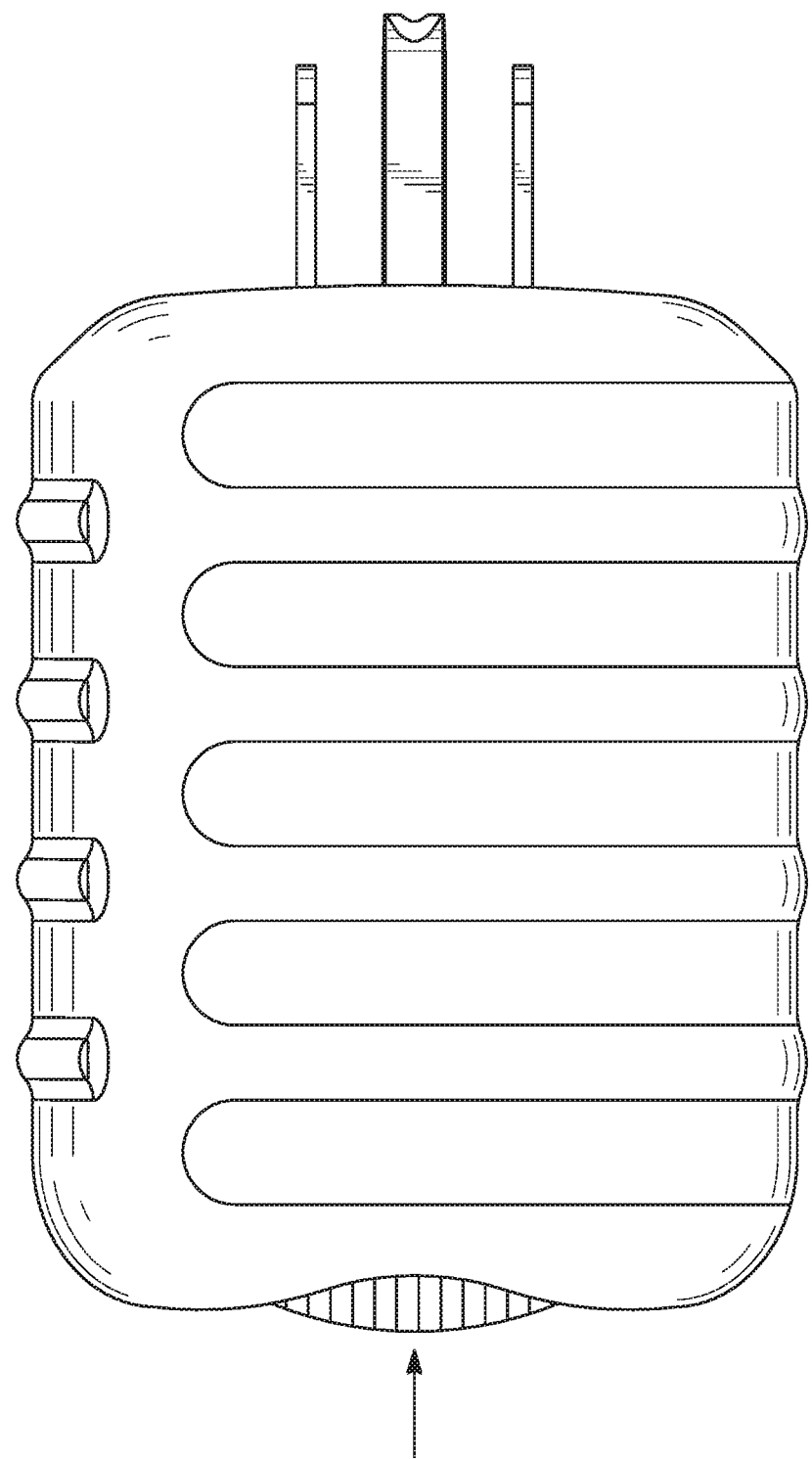
Figure 24:
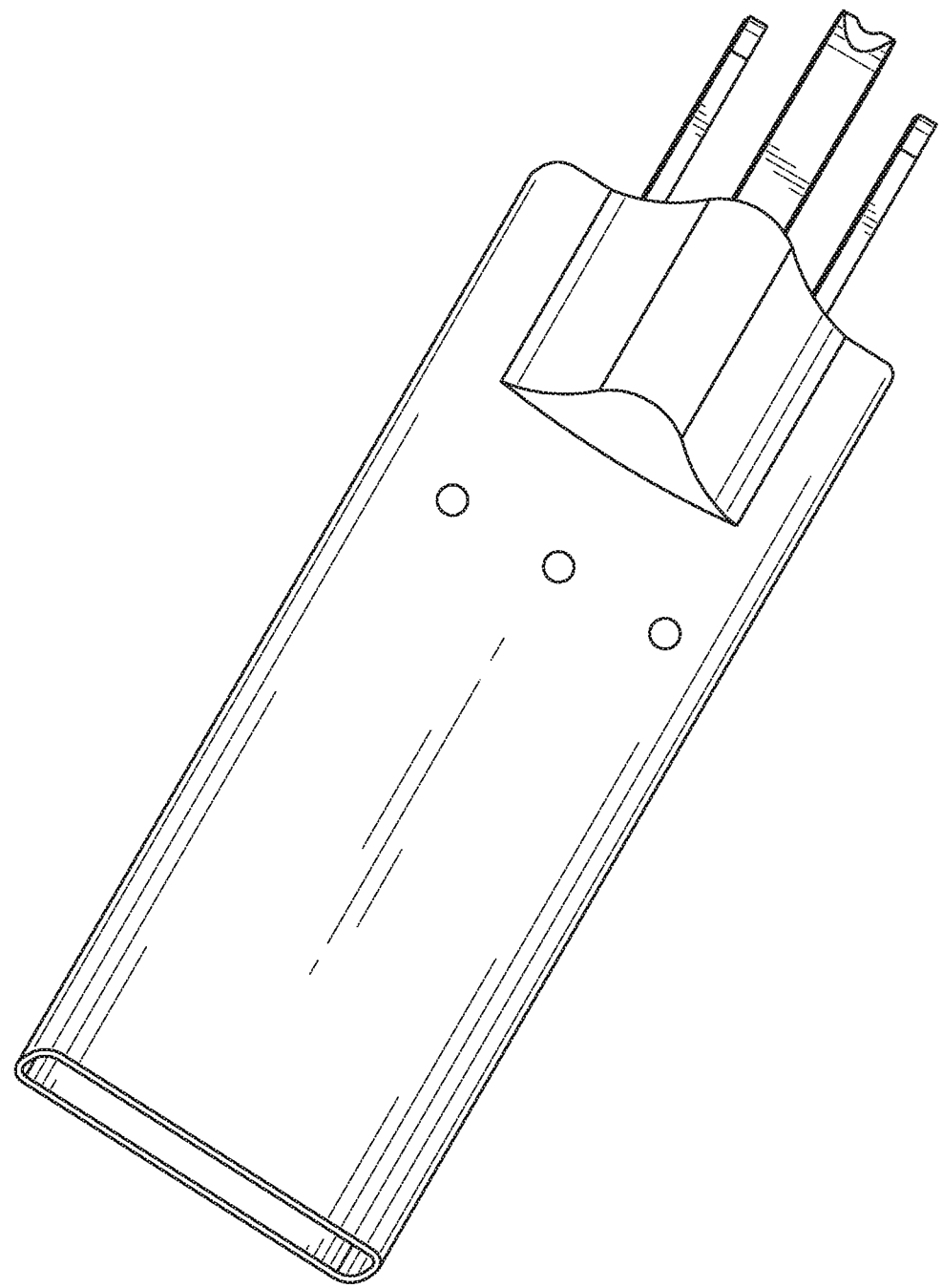
Figure 25:
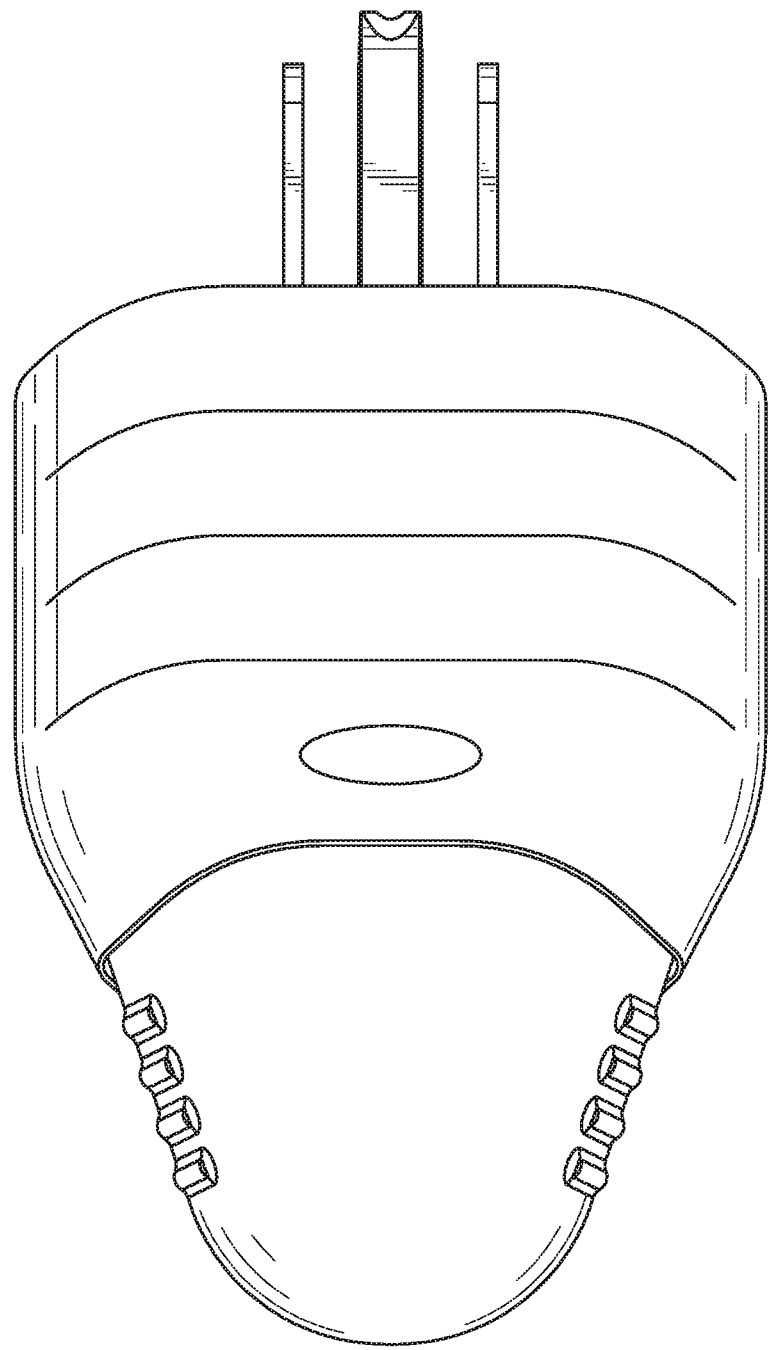
Figure 26:
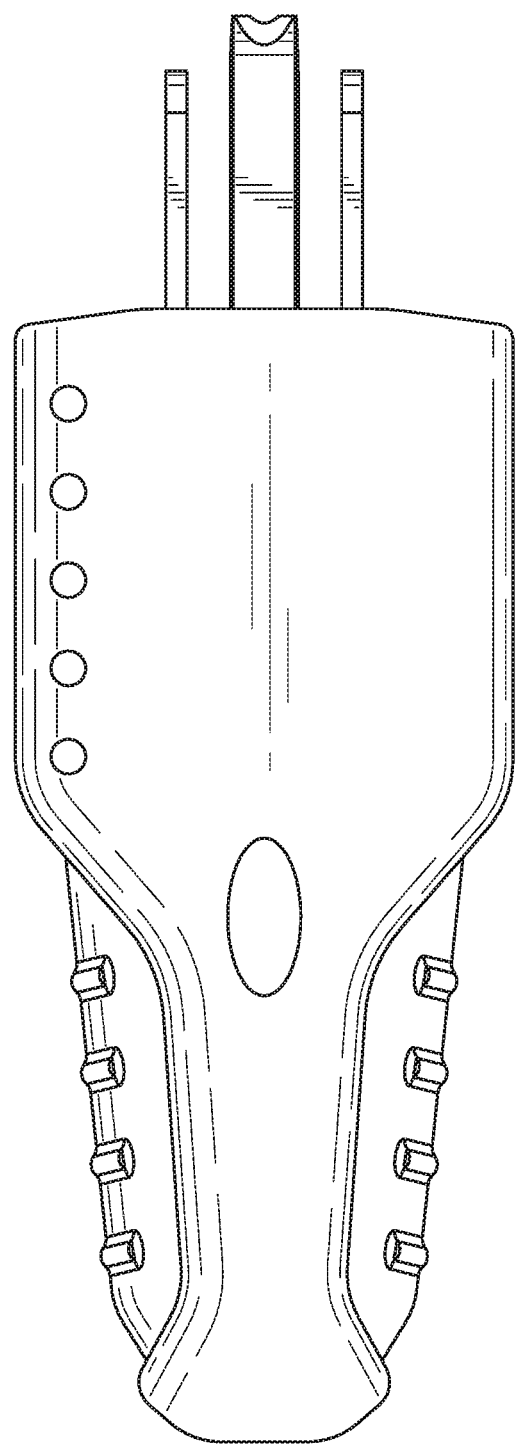
Figure 27:
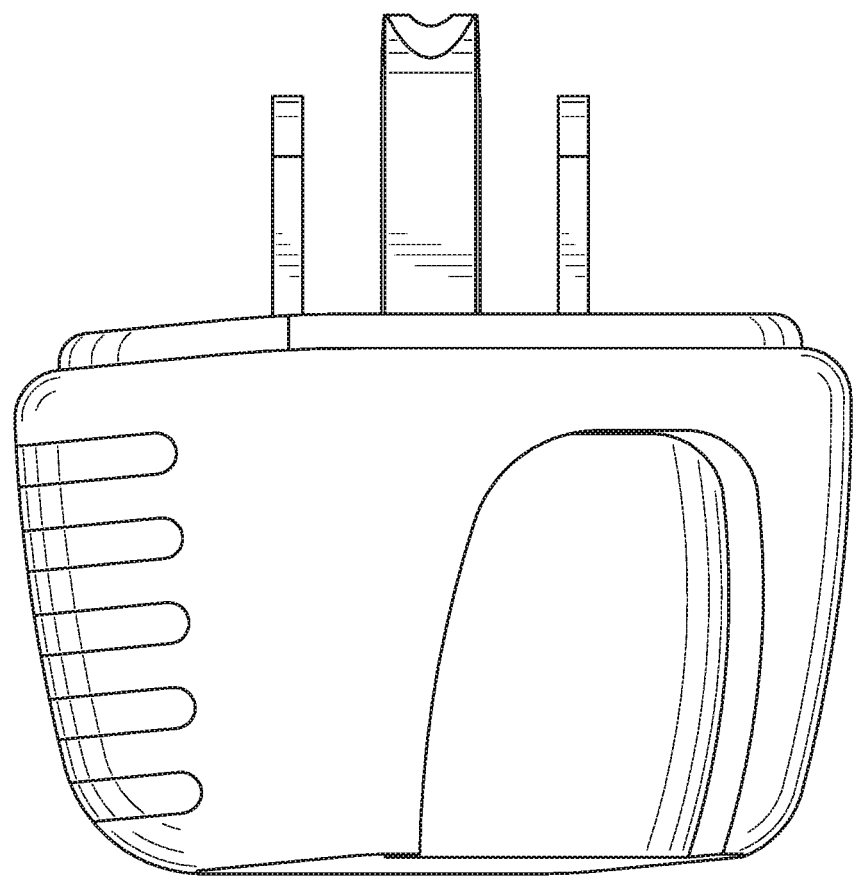
Figure 28:
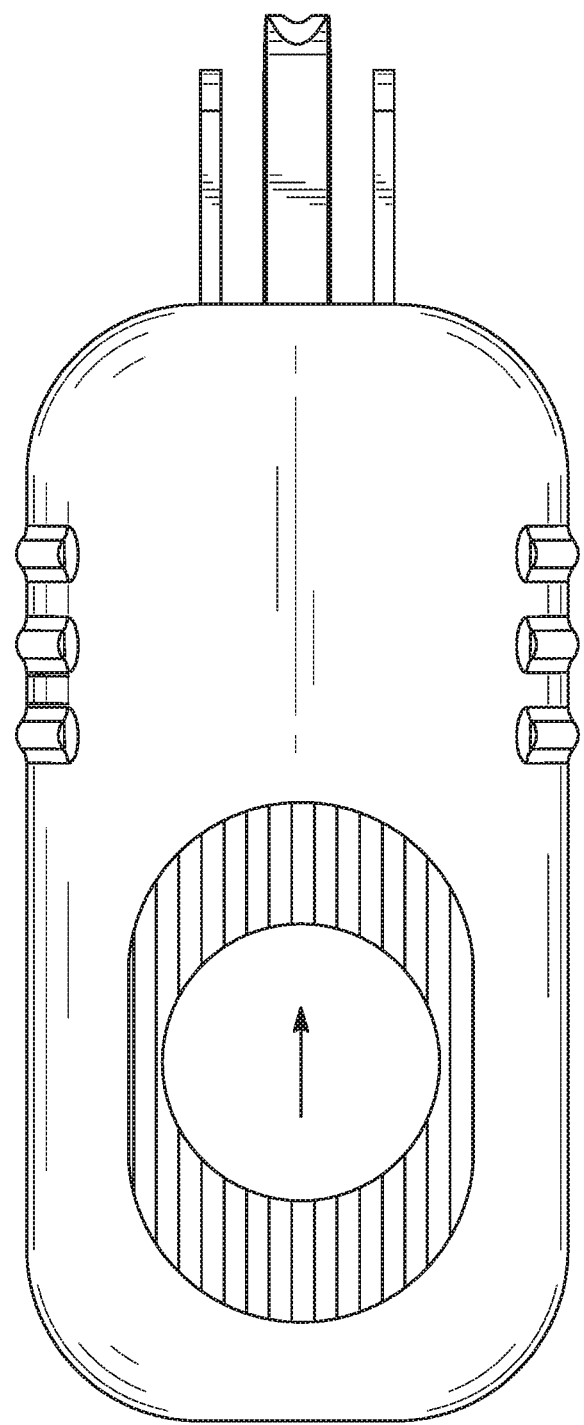
Figure 29:
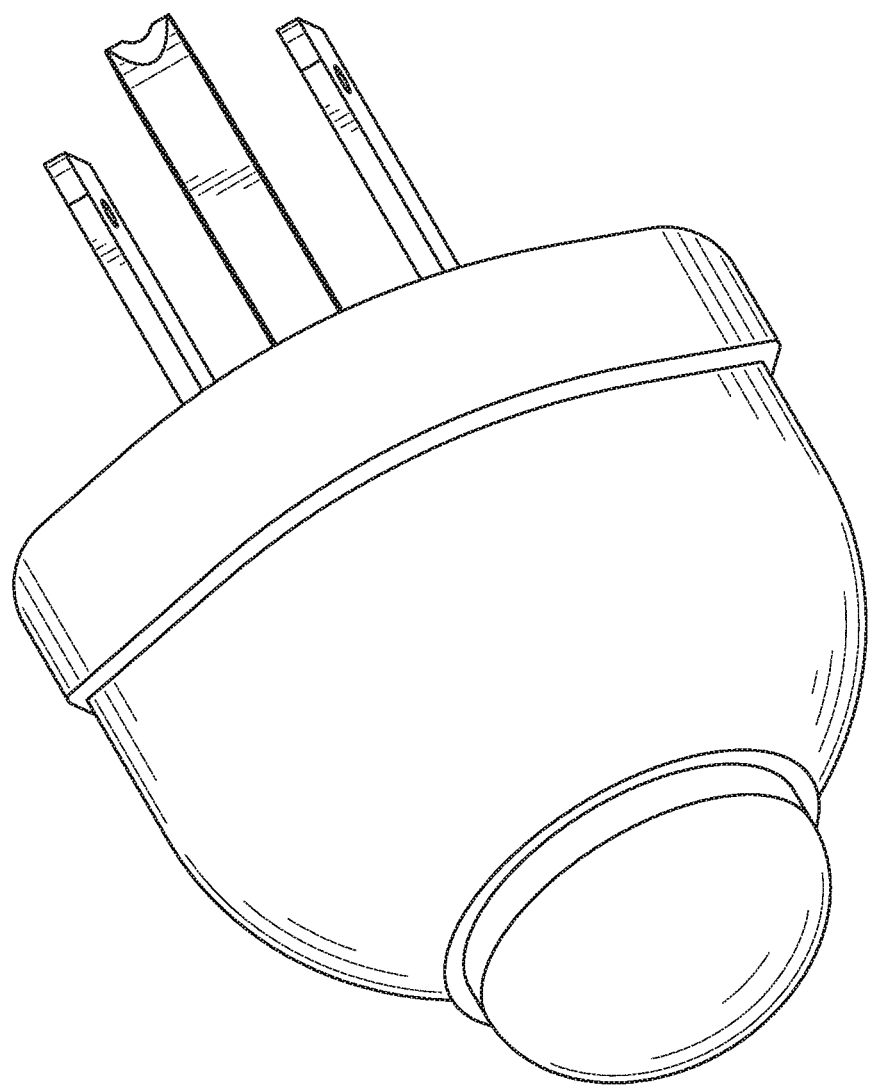
Figure 30:
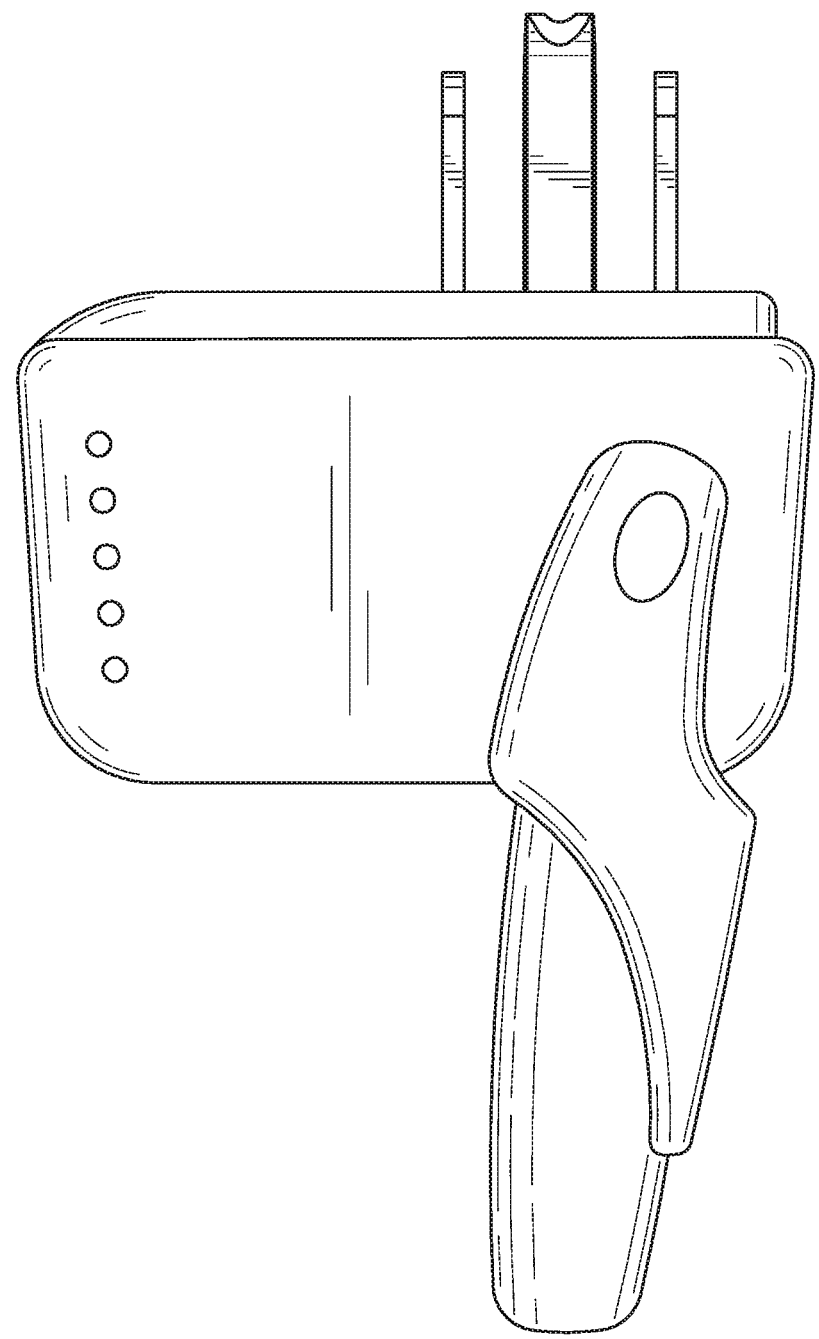
Figure 31:
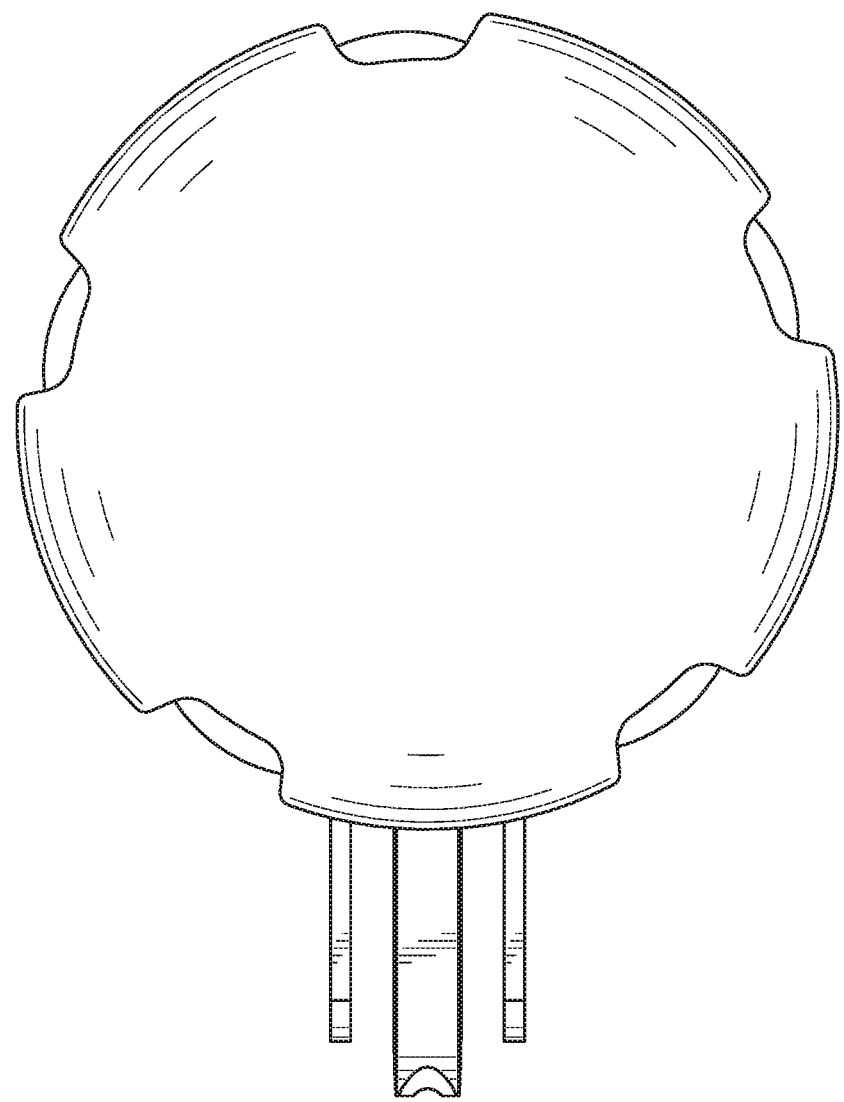
Figure 32:
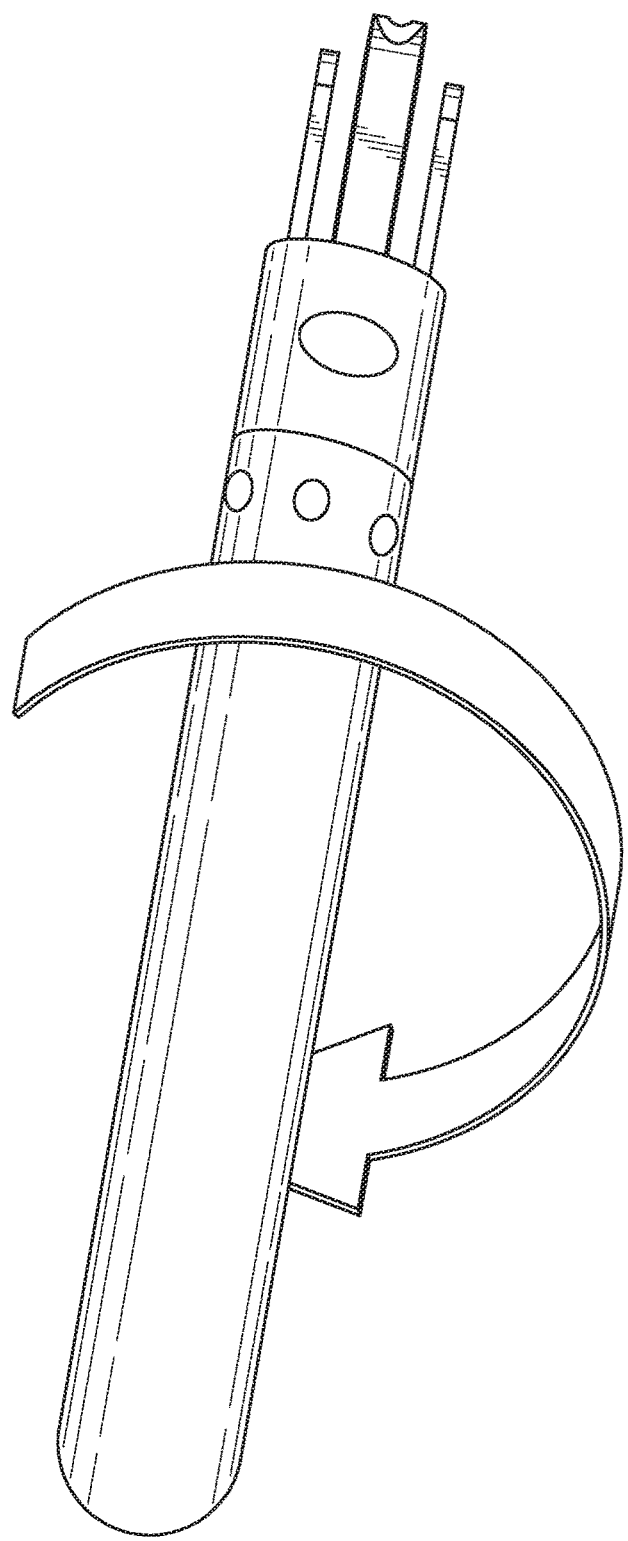
Figure 33:
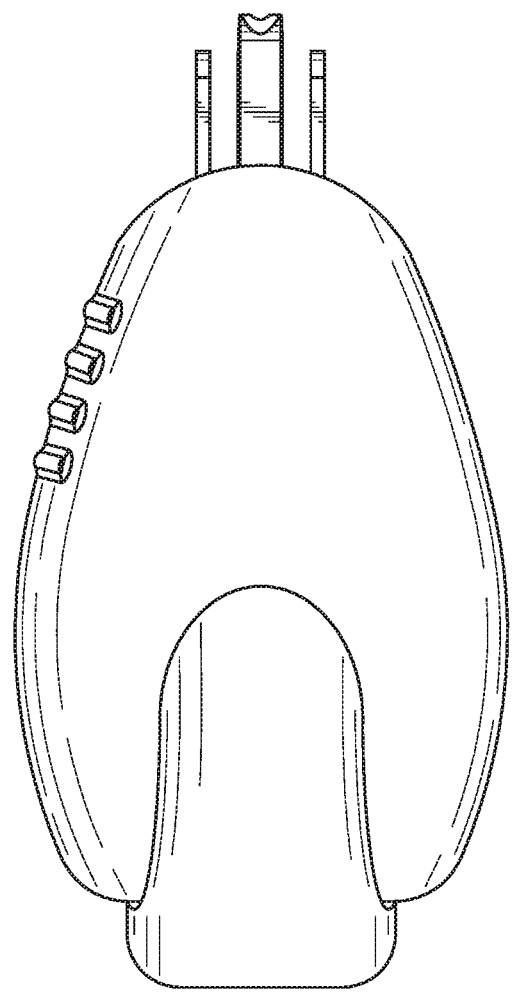
Figure 34:
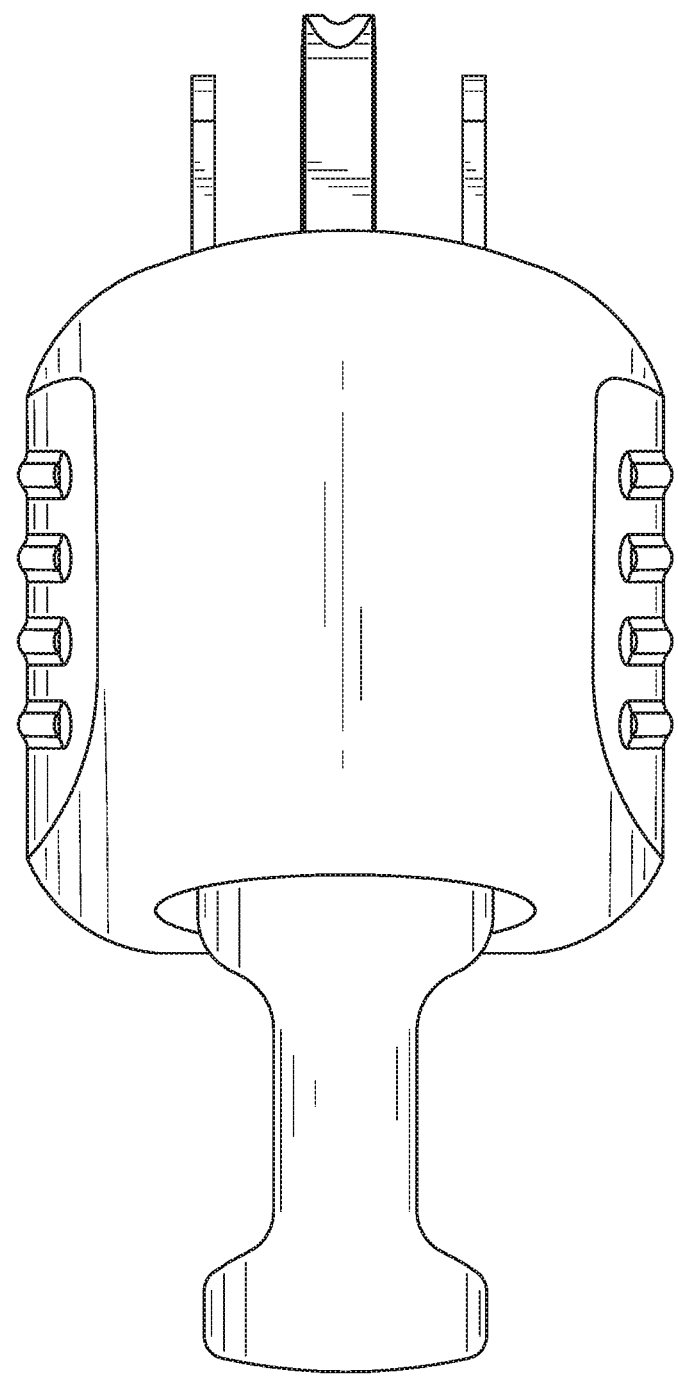
Figure 35:
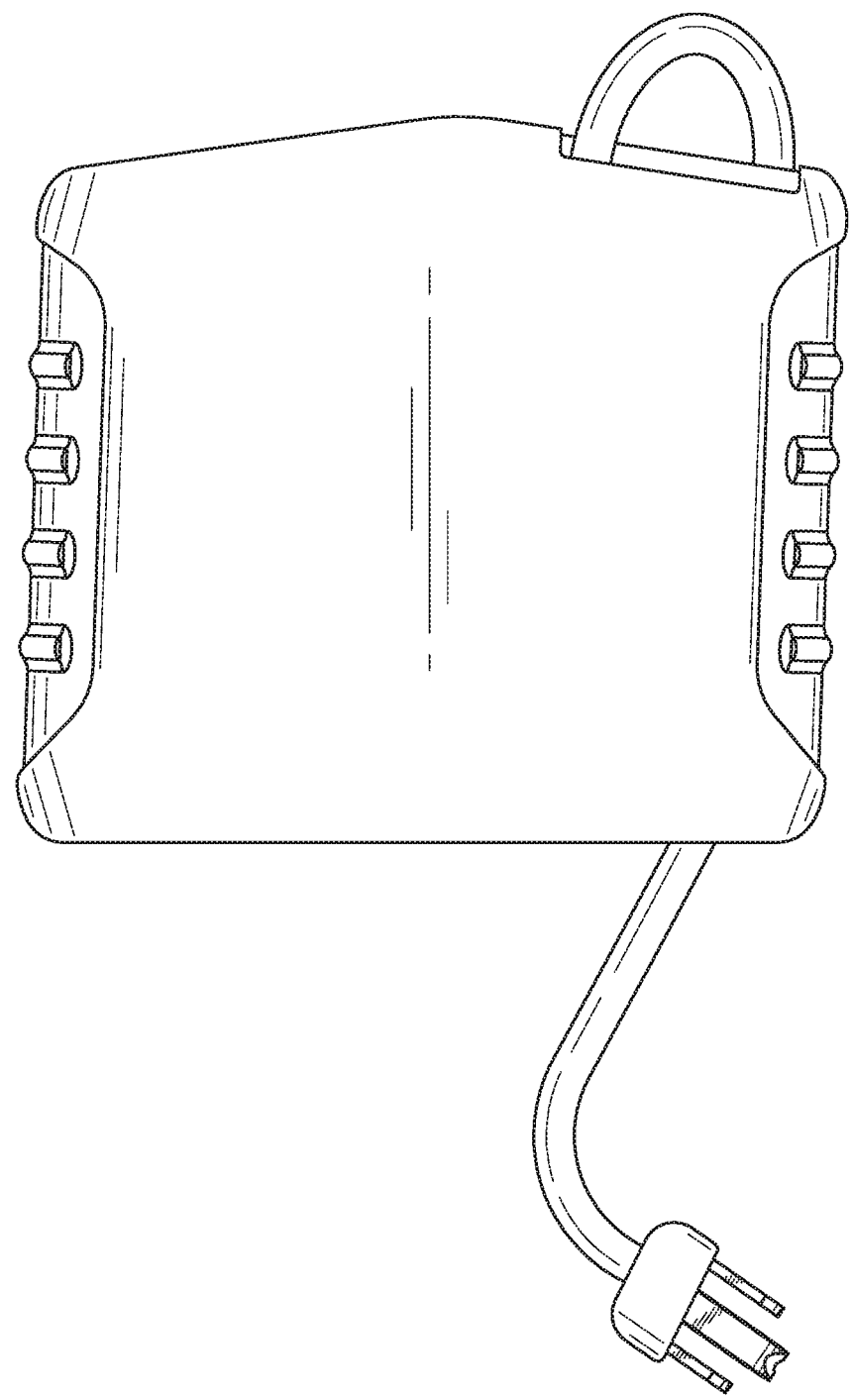
Figure 36:
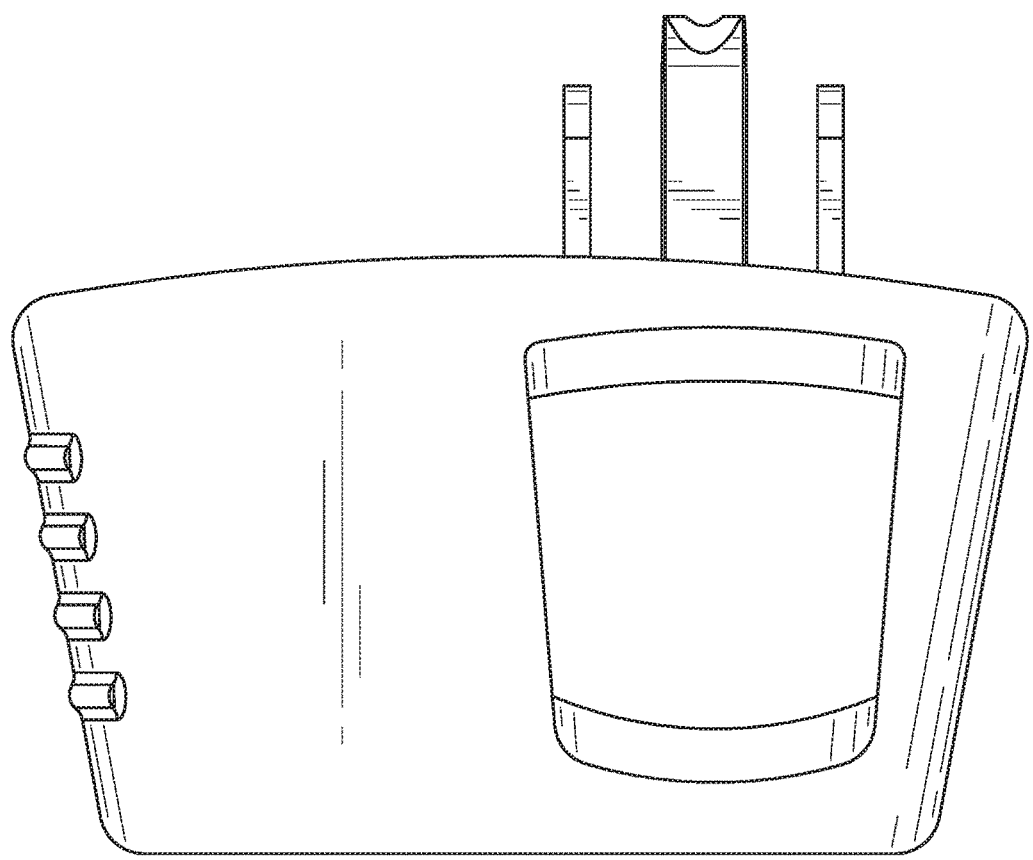
Figure 37:
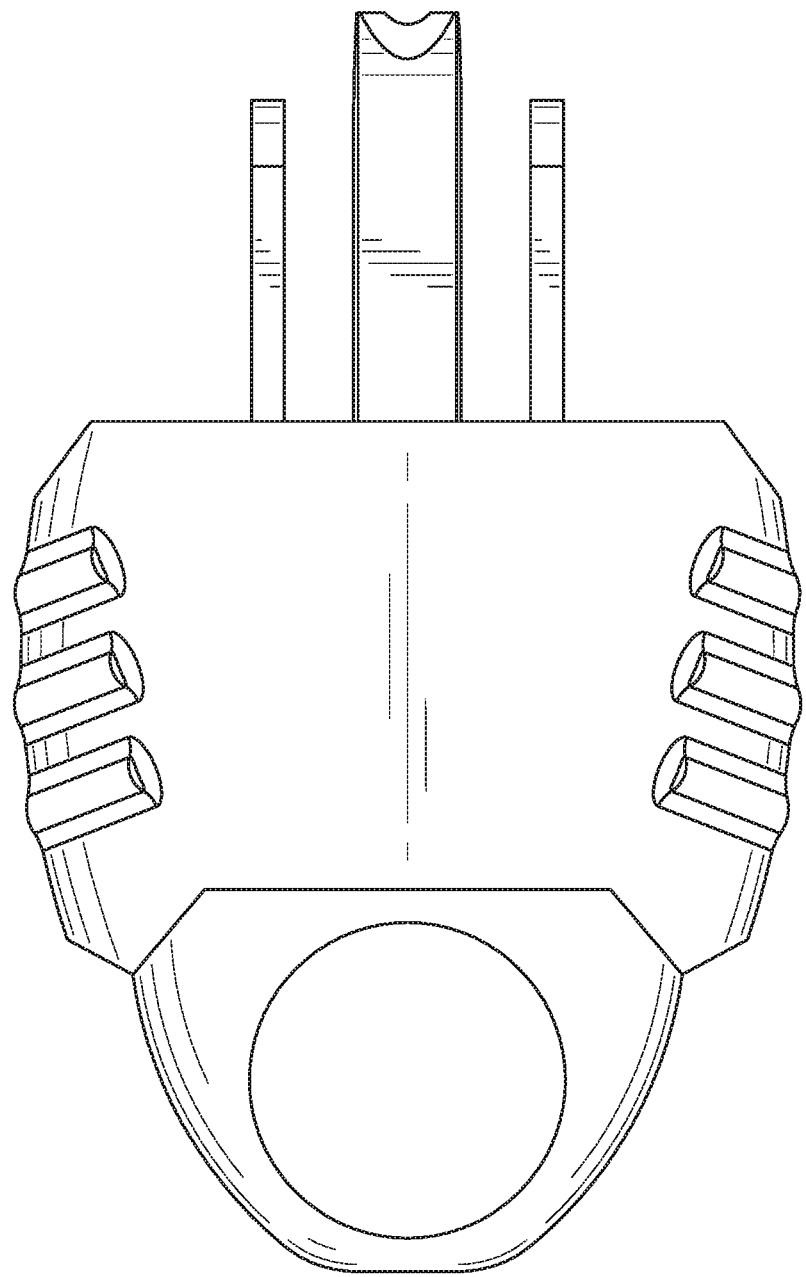
Figure 38:
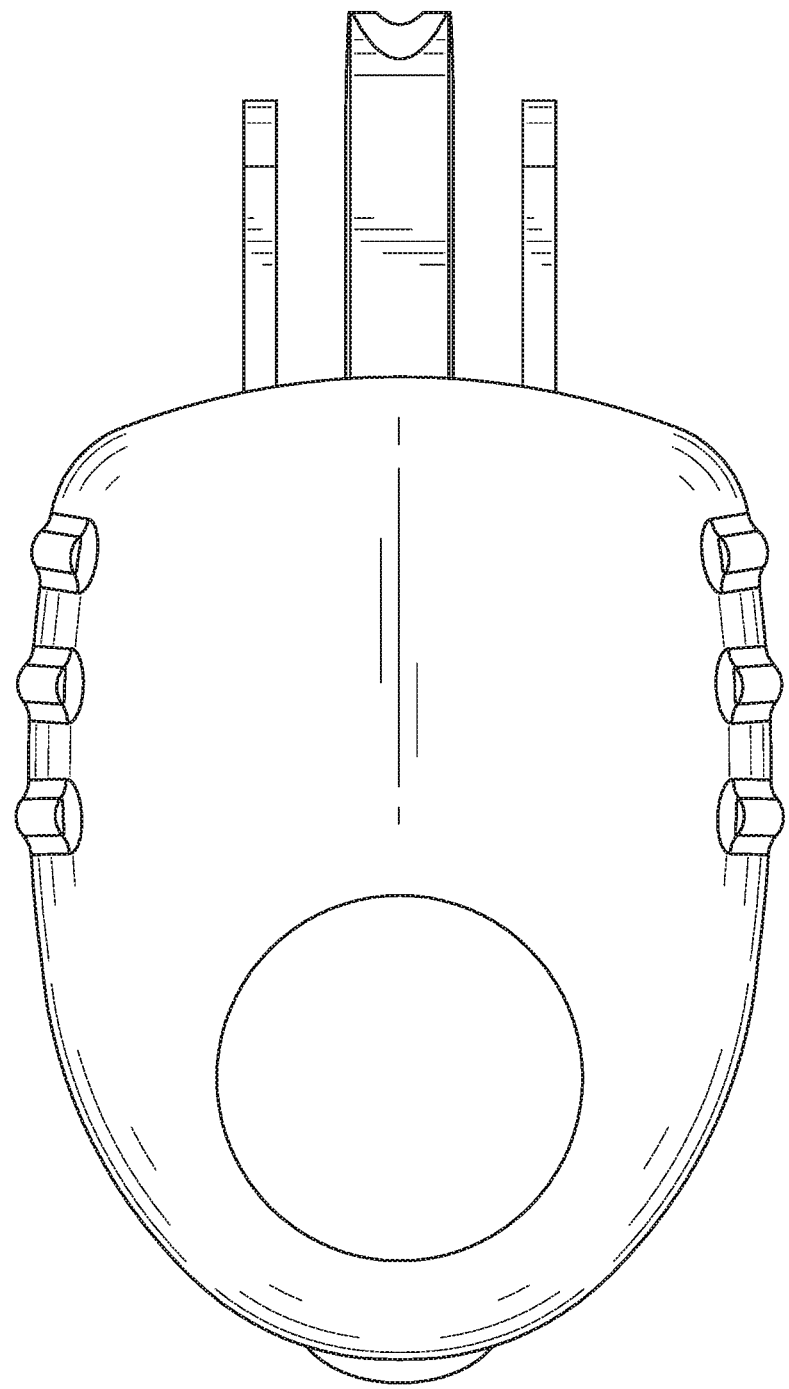
Figure 39:
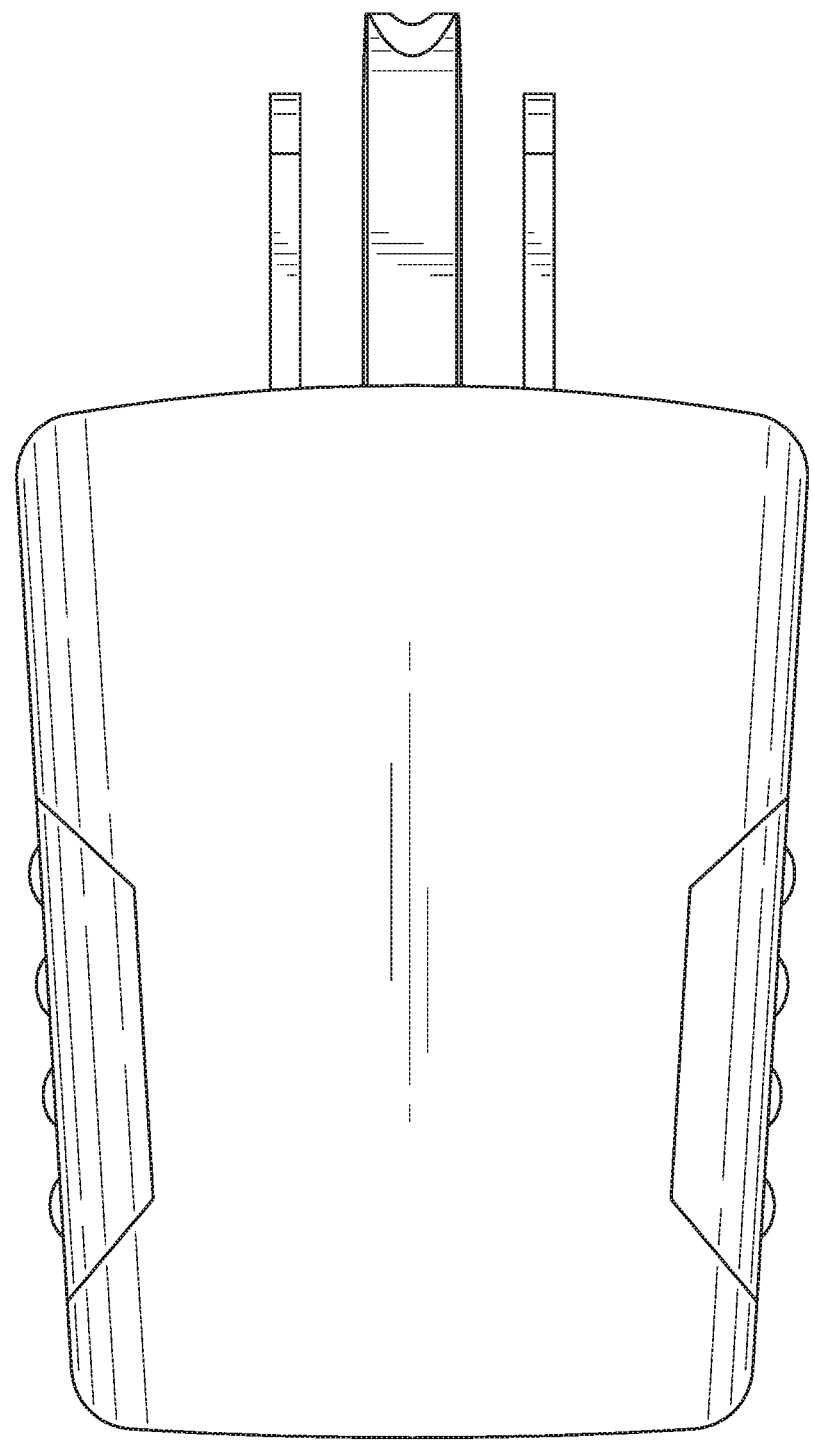
Figure 40:
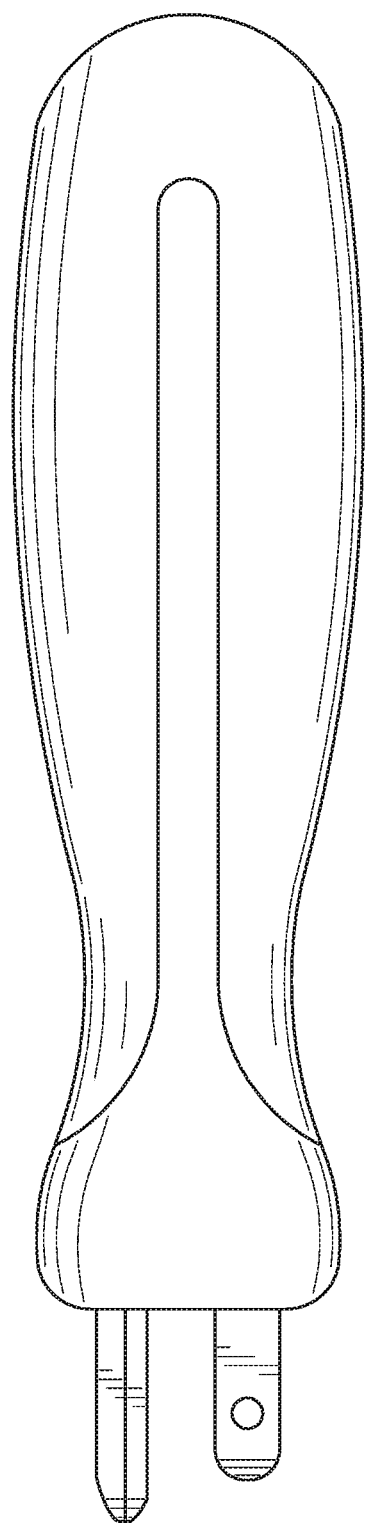
Figure 41:
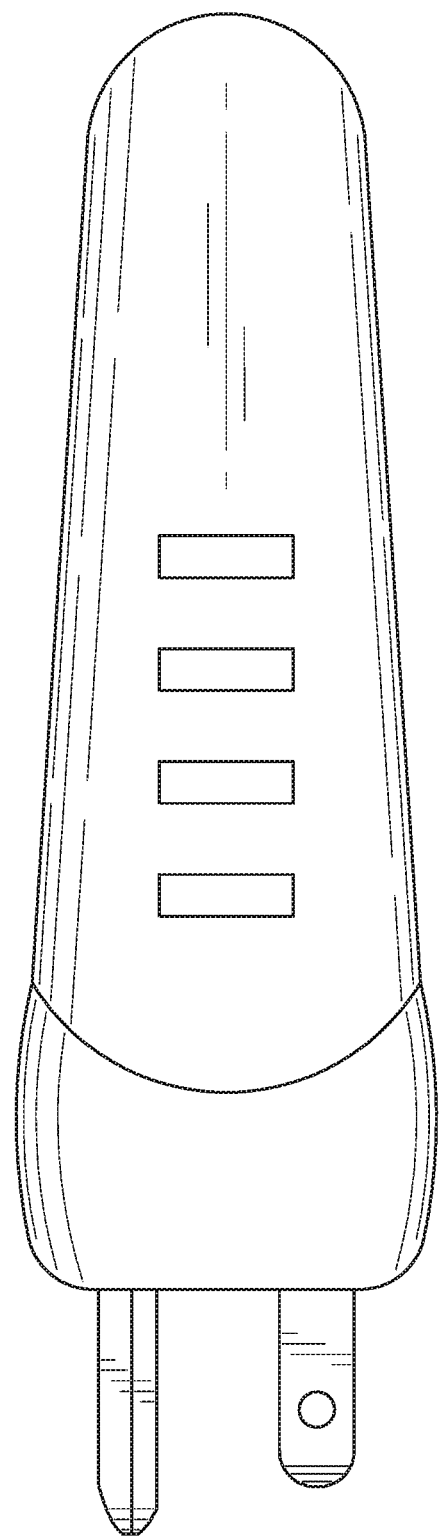
Figure 42:
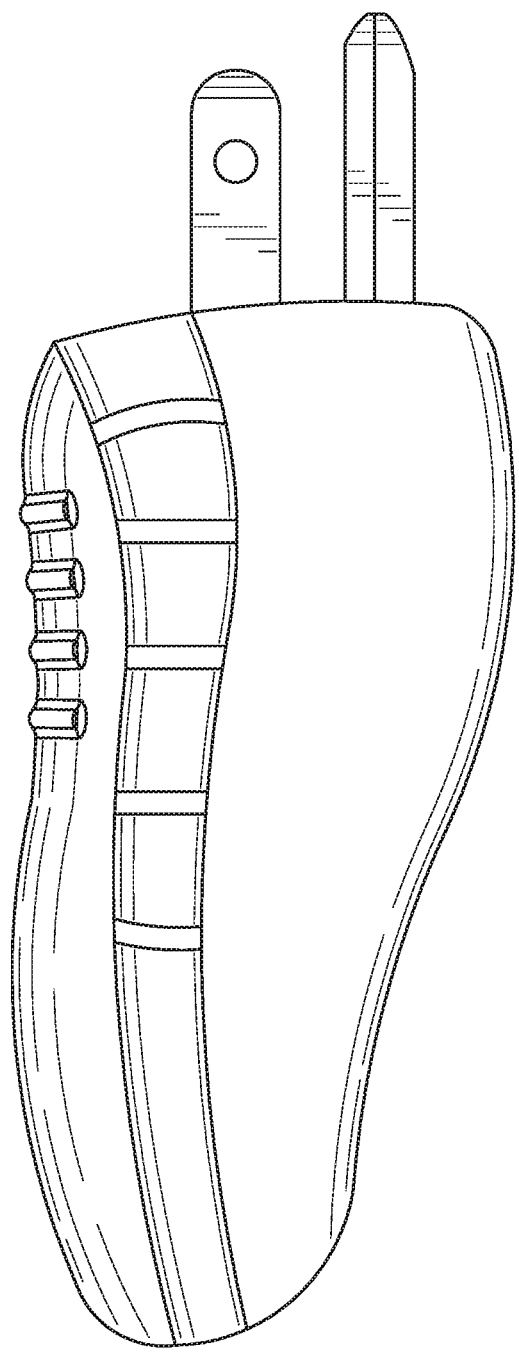
Figure 43:
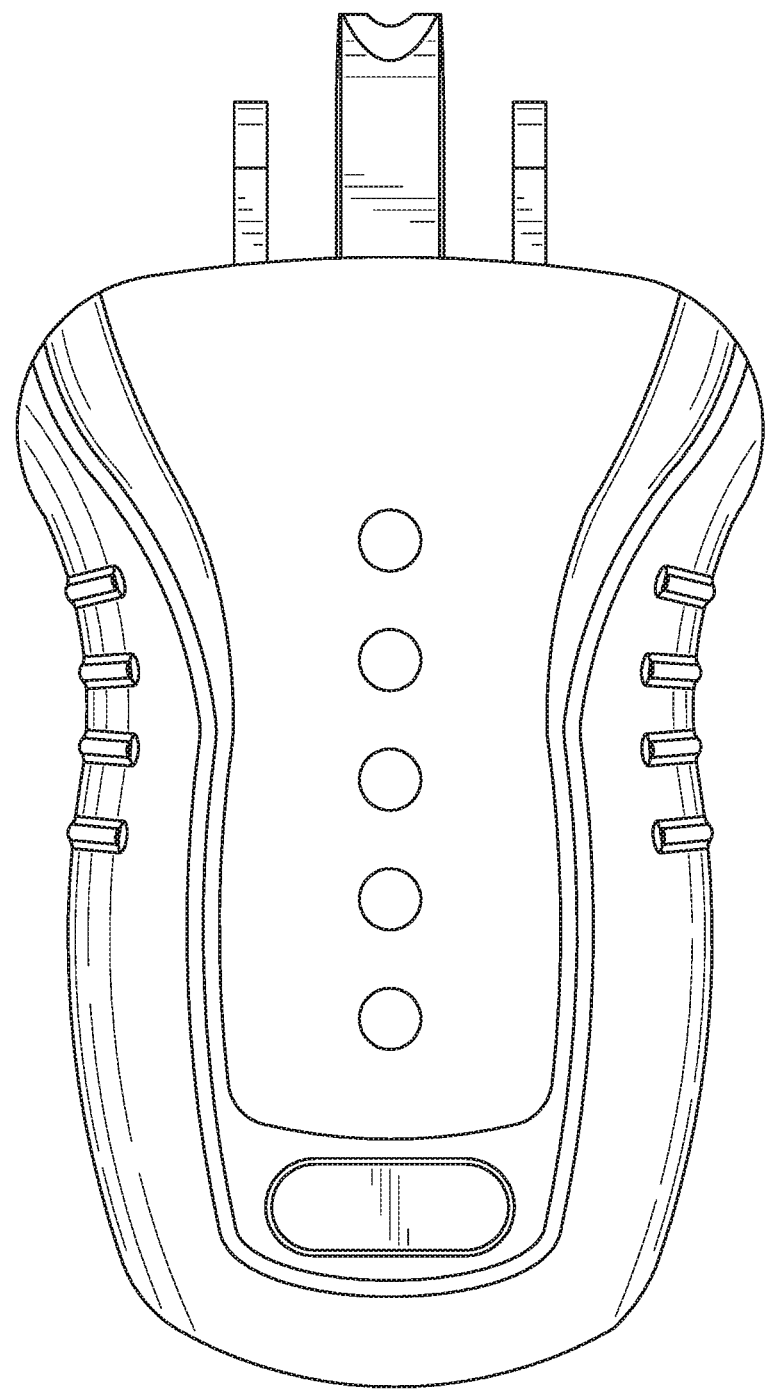
Figure 44:
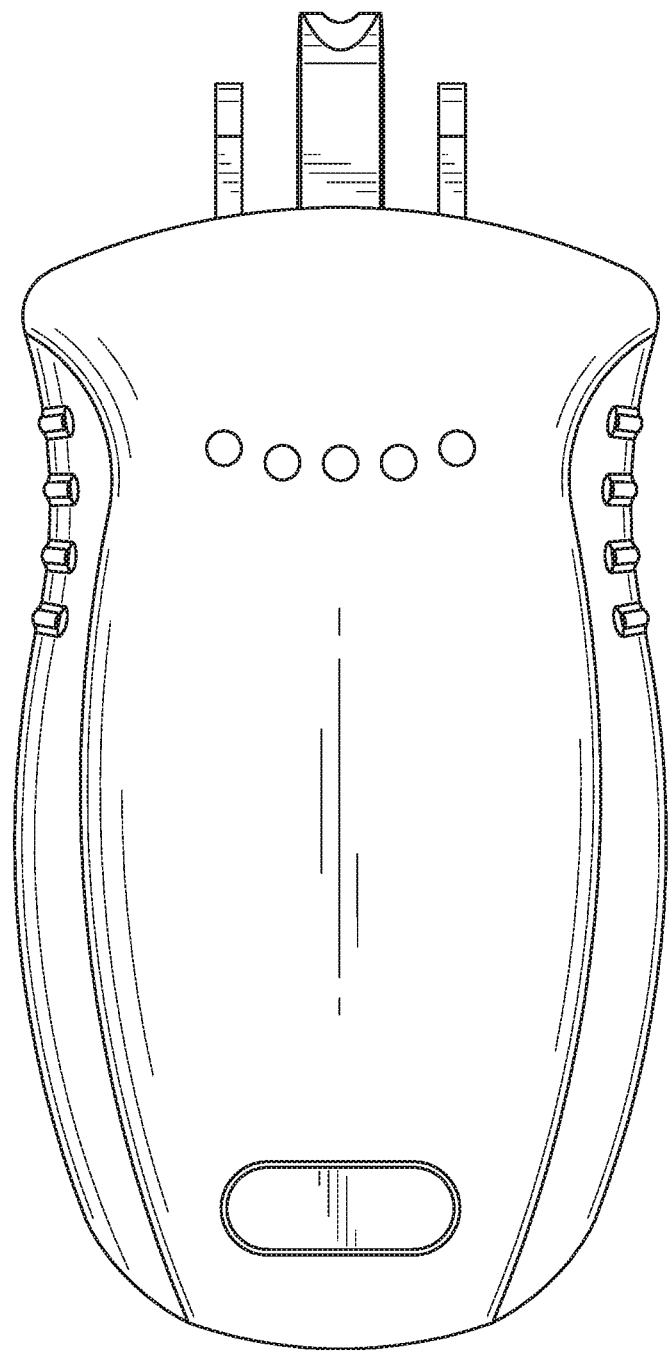
Figure 45:
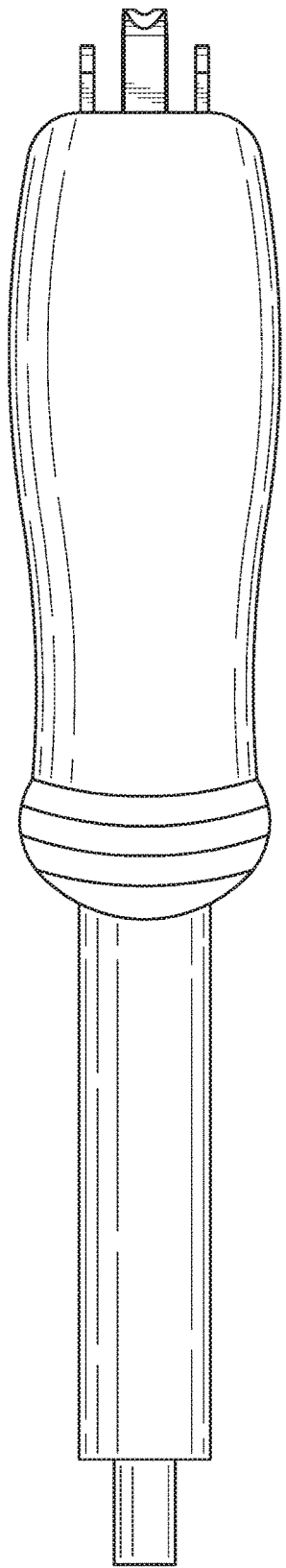
Figure 46:
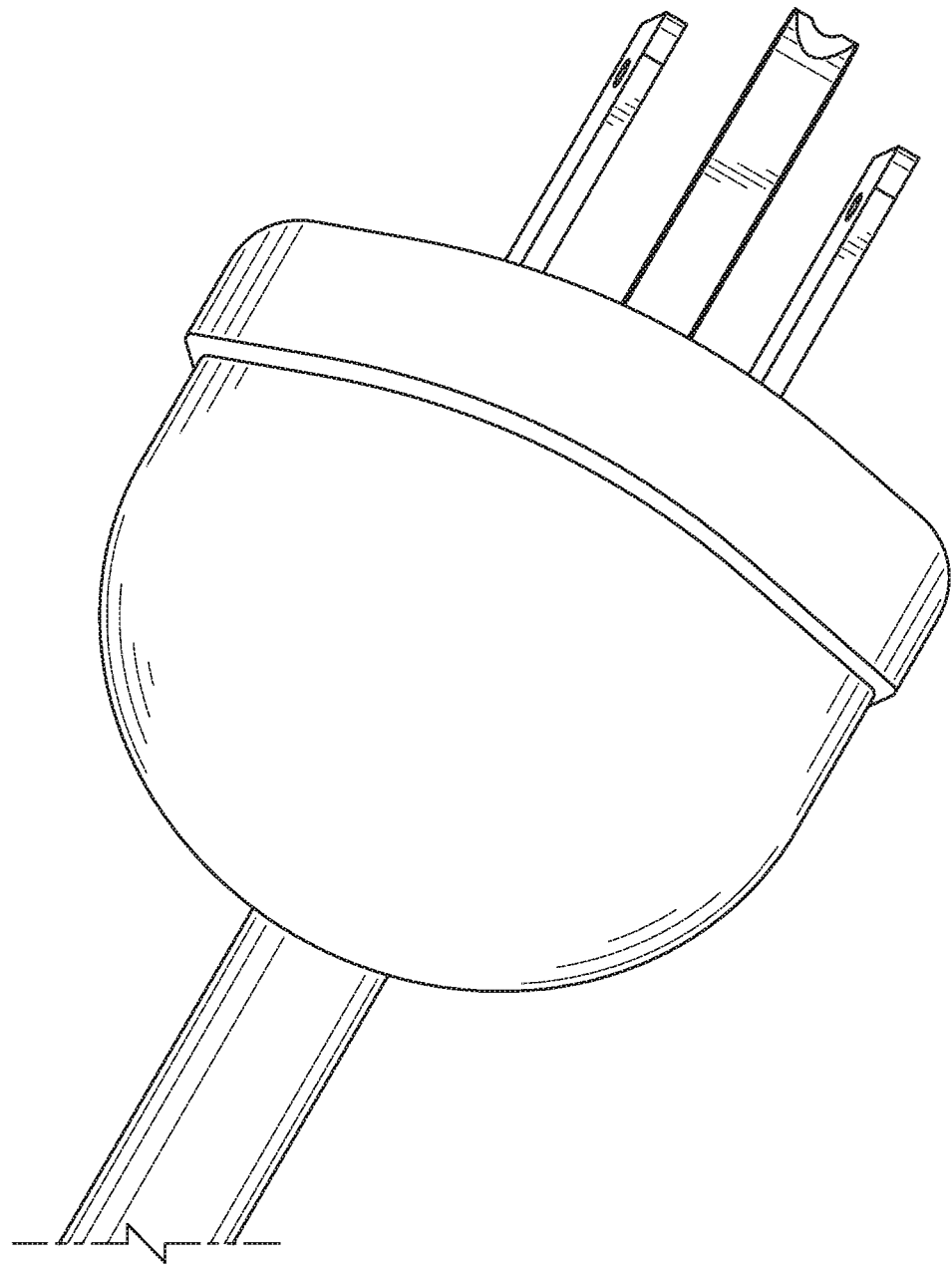
Figure 47:
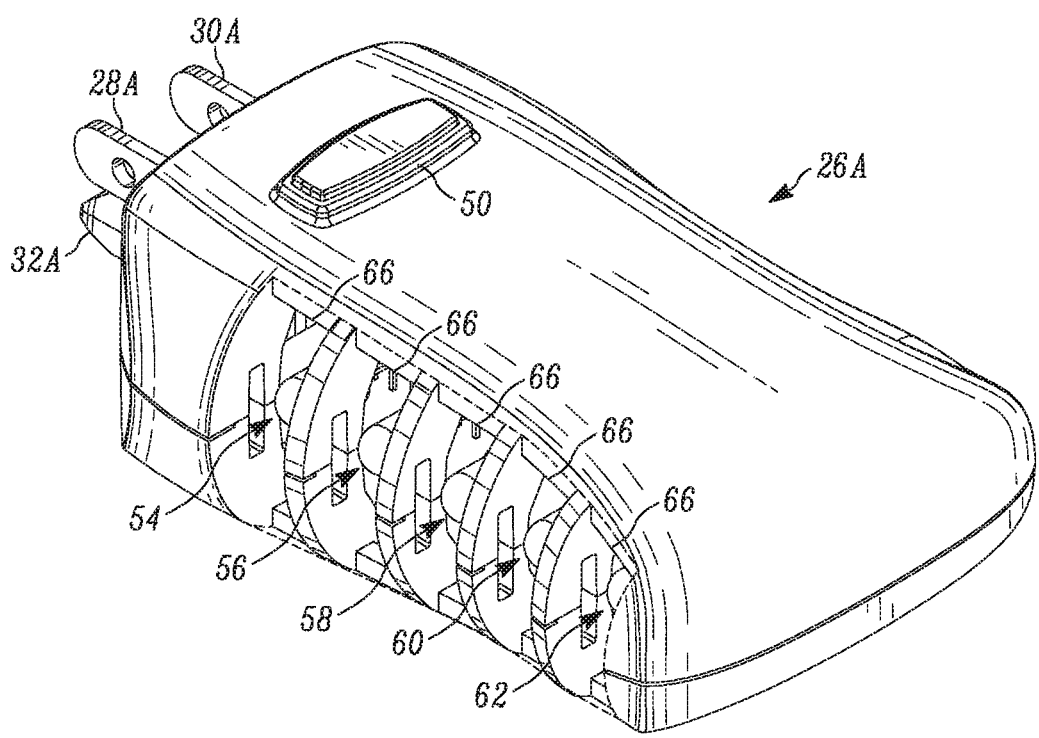
FIGS. 47-61 are views of another embodiment of a receptacle tester.
Figure 48:
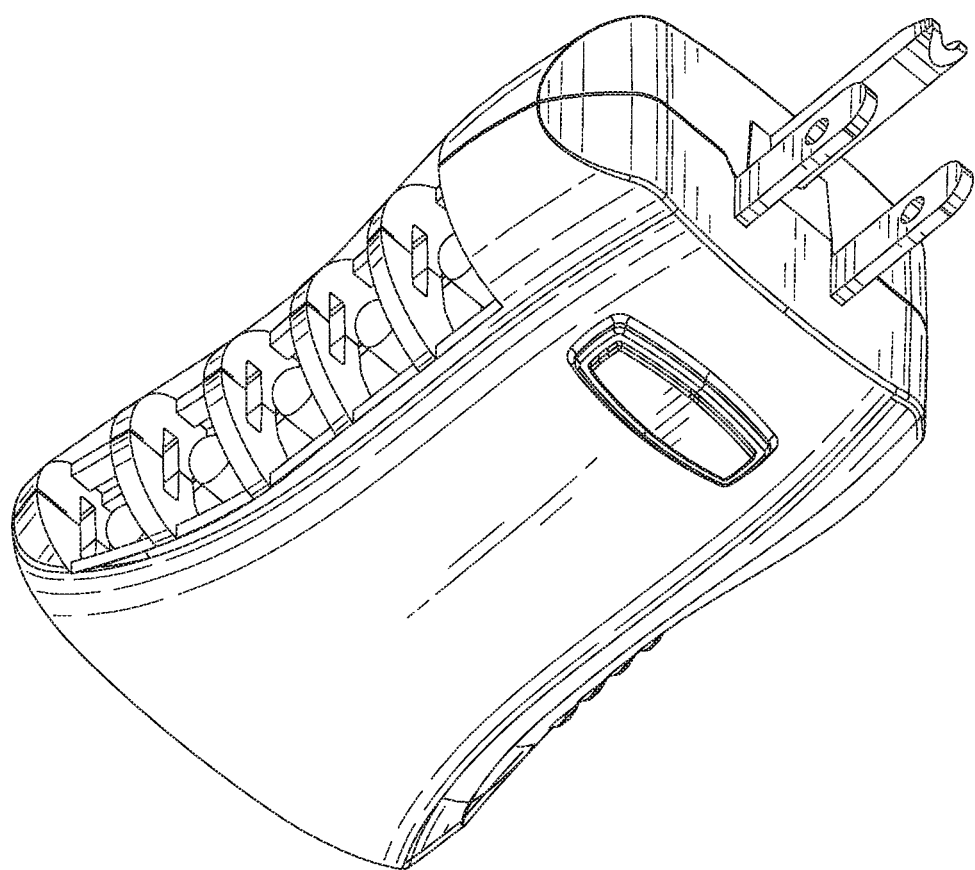
Figure 49:
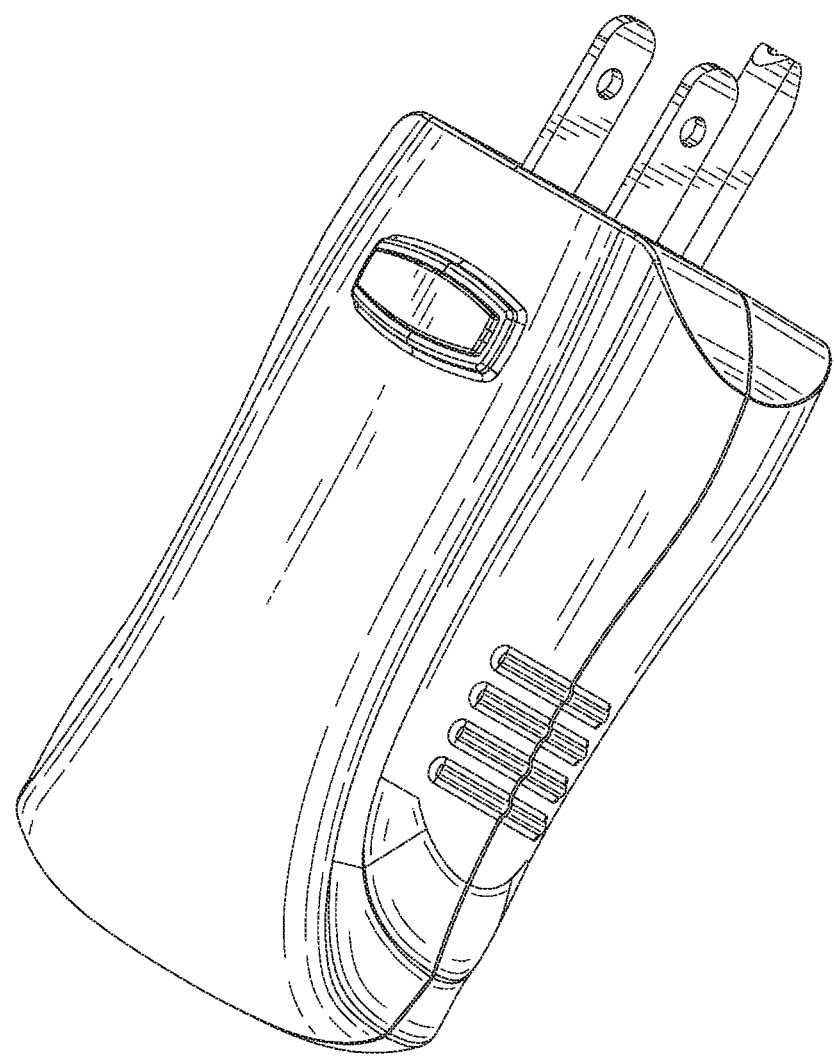
Figure 50:
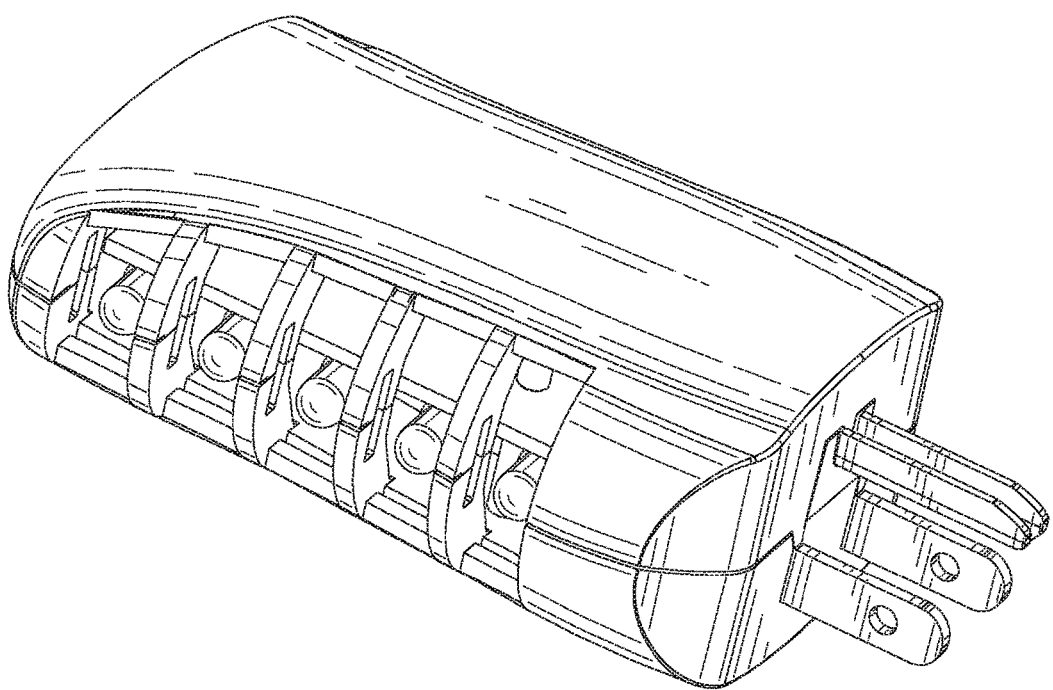
Figure 51:
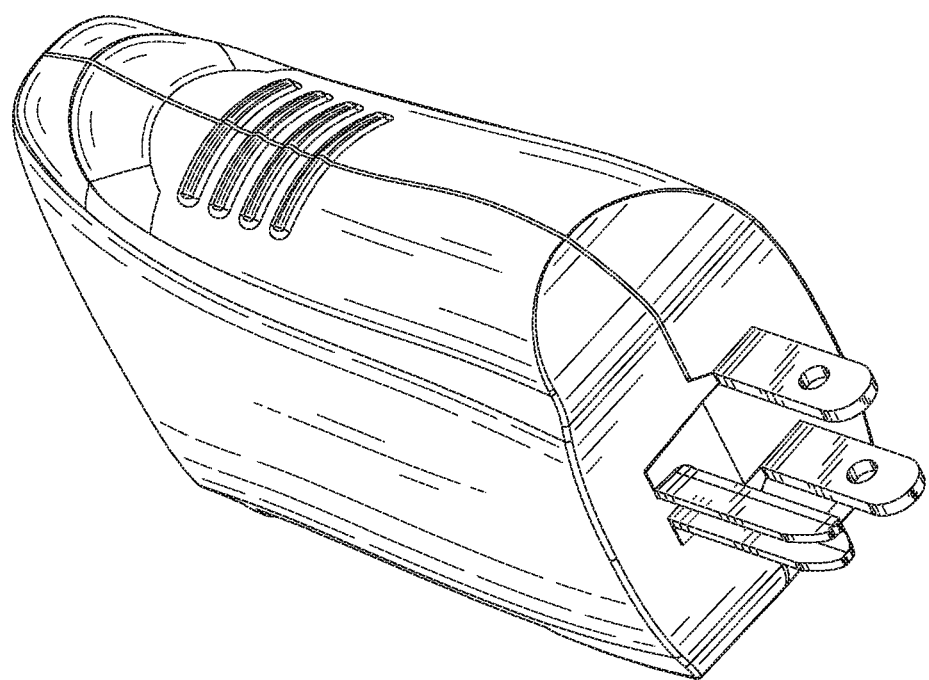
Figure 52:
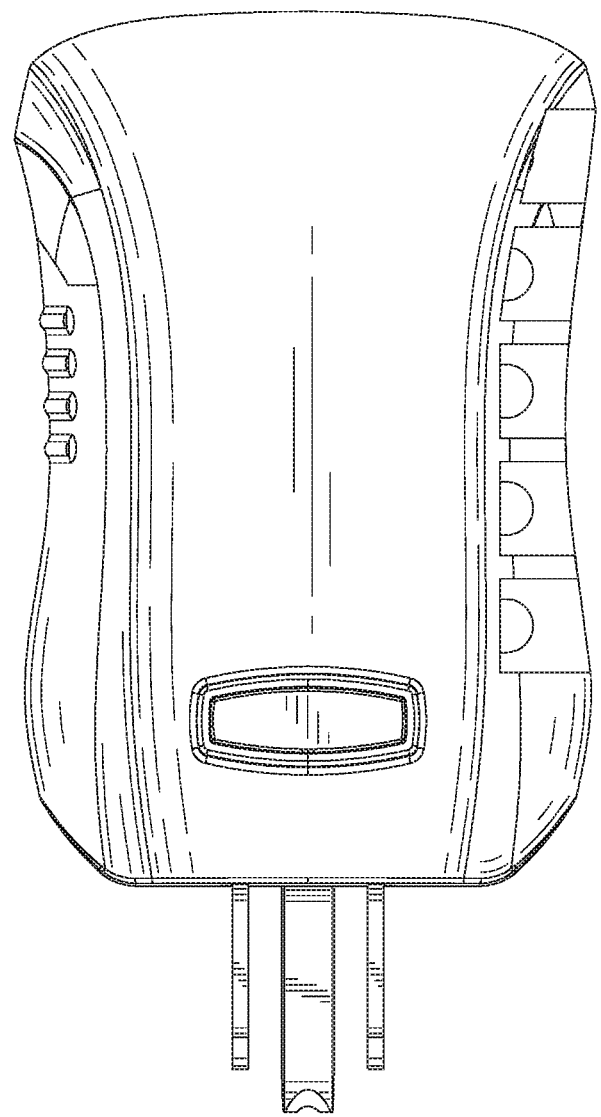
Figure 53:
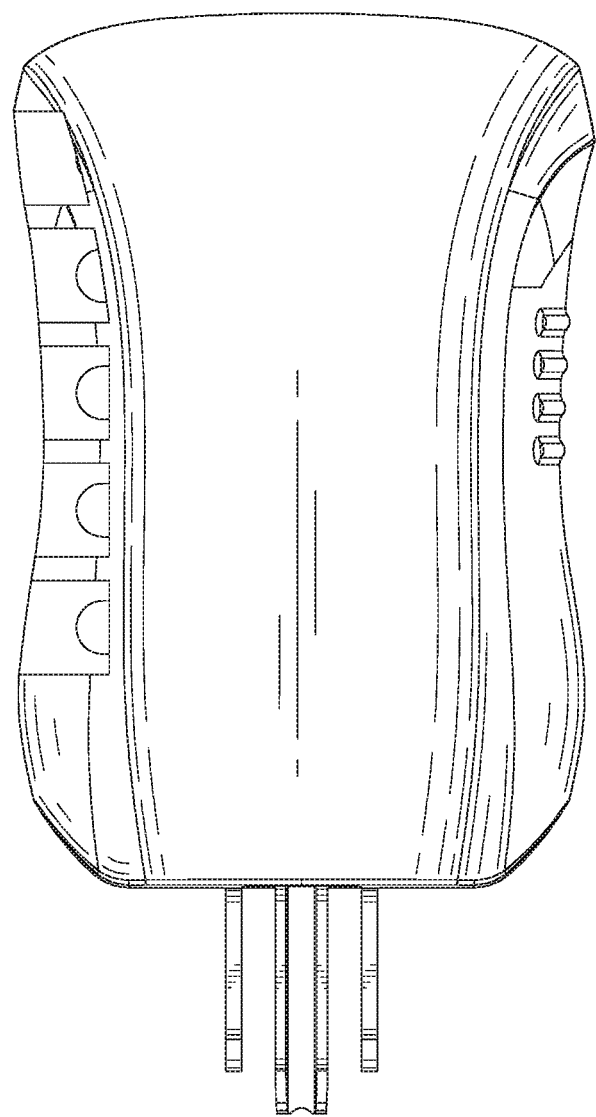
Figure 54:
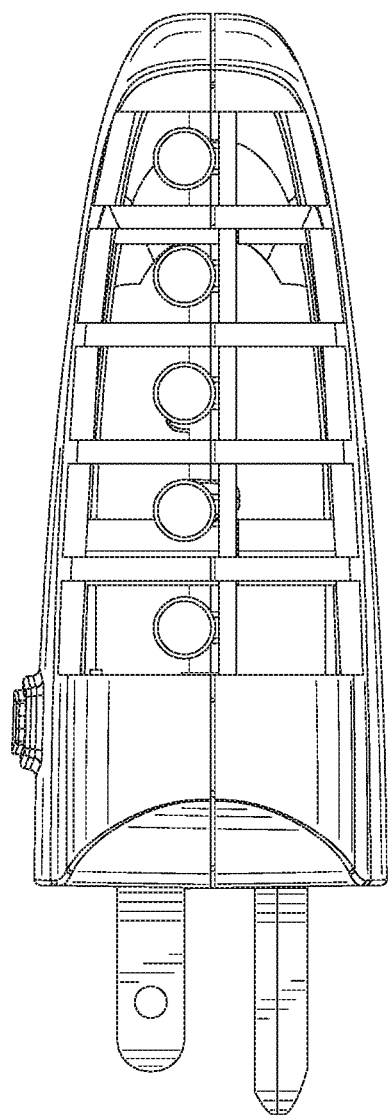
Figure 55:
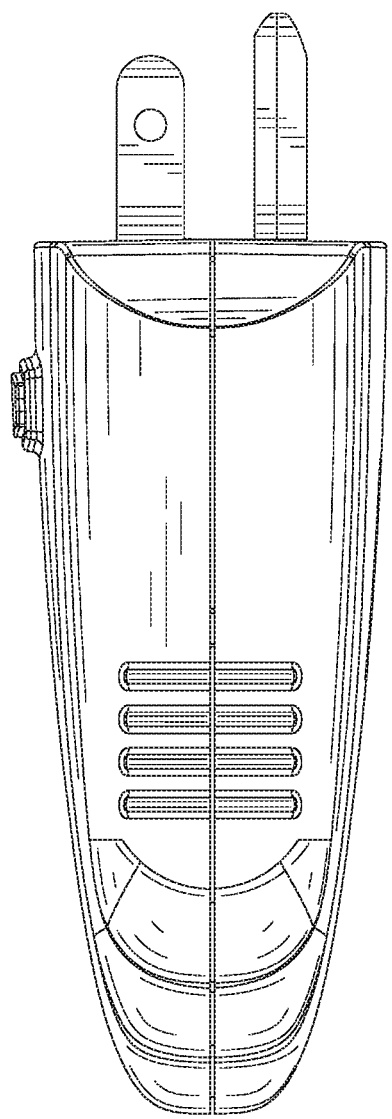
Figure 56:
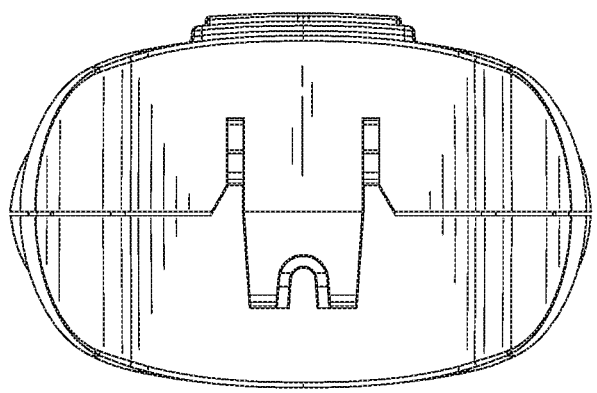
Figure 57:
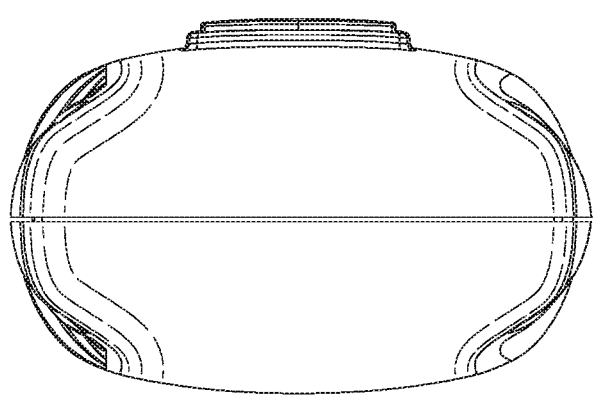
Figure 58:
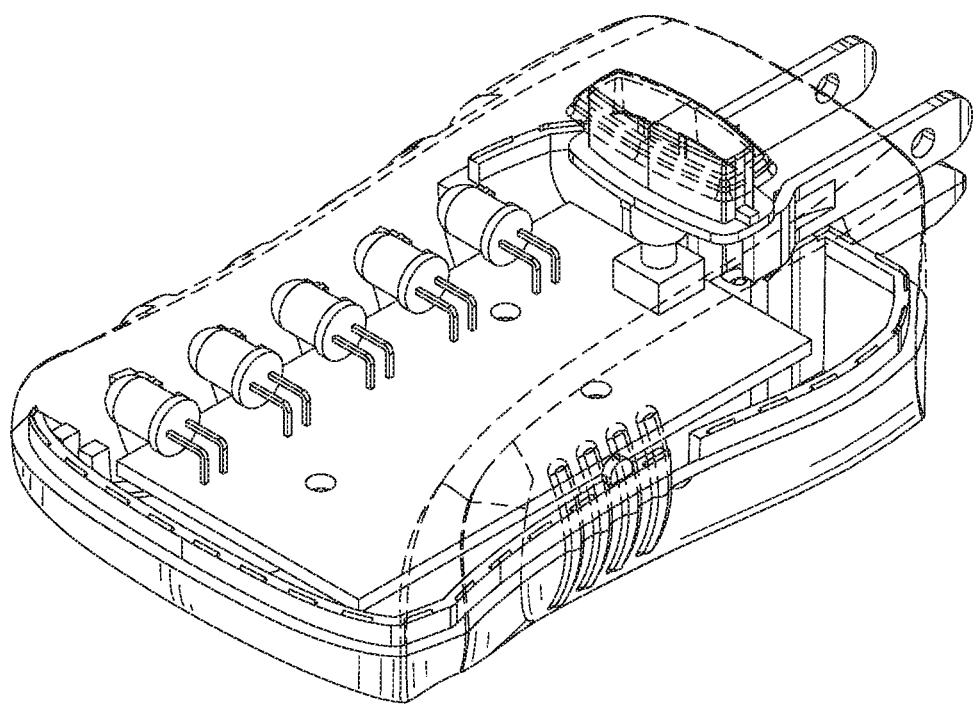
Figure 59:
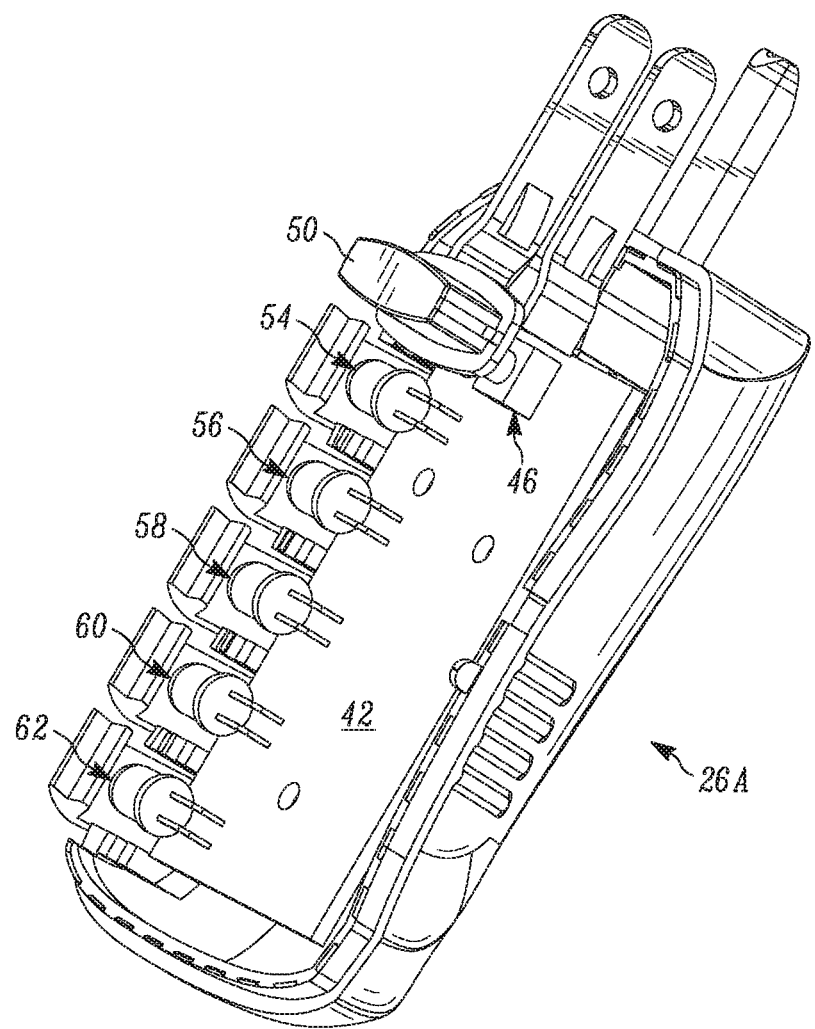
Figure 60:
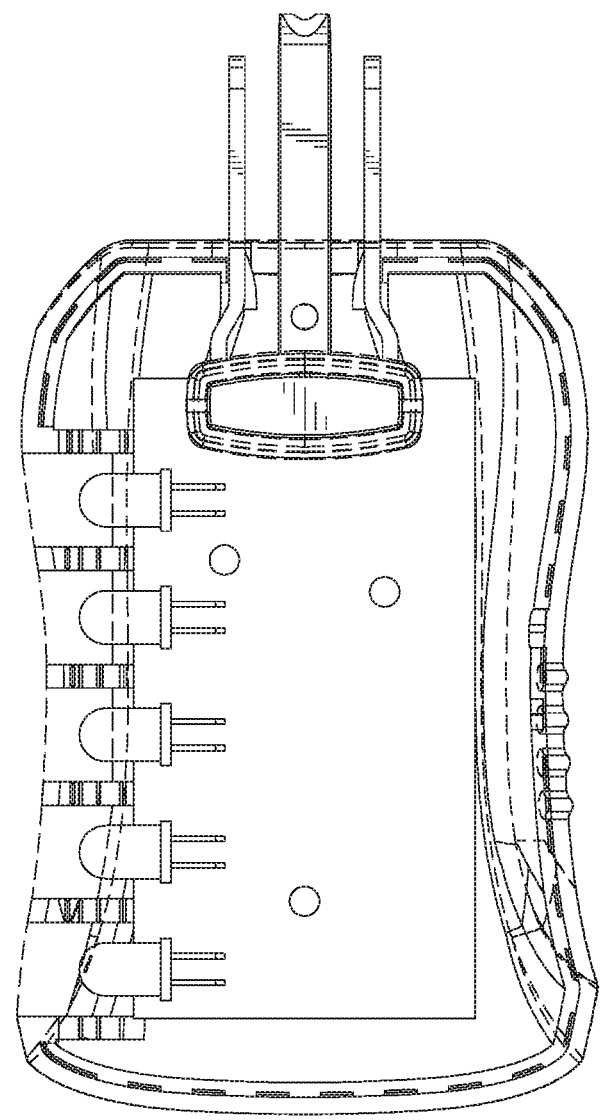
Figure 61:
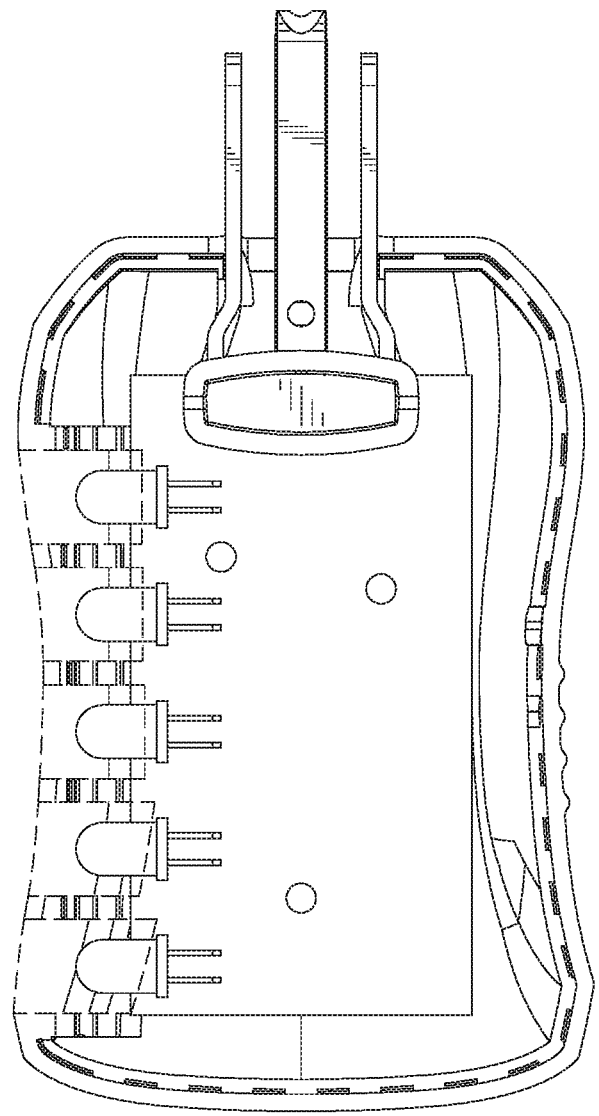

FIGS. 13-46 illustrate alternative embodiments practicing the invention including it being incorporated into the handle of a screwdriver or other tool in FIGS. 13-16; pocket versions in FIGS. 17-18; a card form version in FIGS. 19-20; and other different shapes and lighting configurations in FIGS. 21-46.

FIGS. 47-61 illustrate an alternative construction of a receptacle tester 26A. The tester 26A is similar to the tester 26 described above, and common elements have the same reference number "A".

Figure 68:
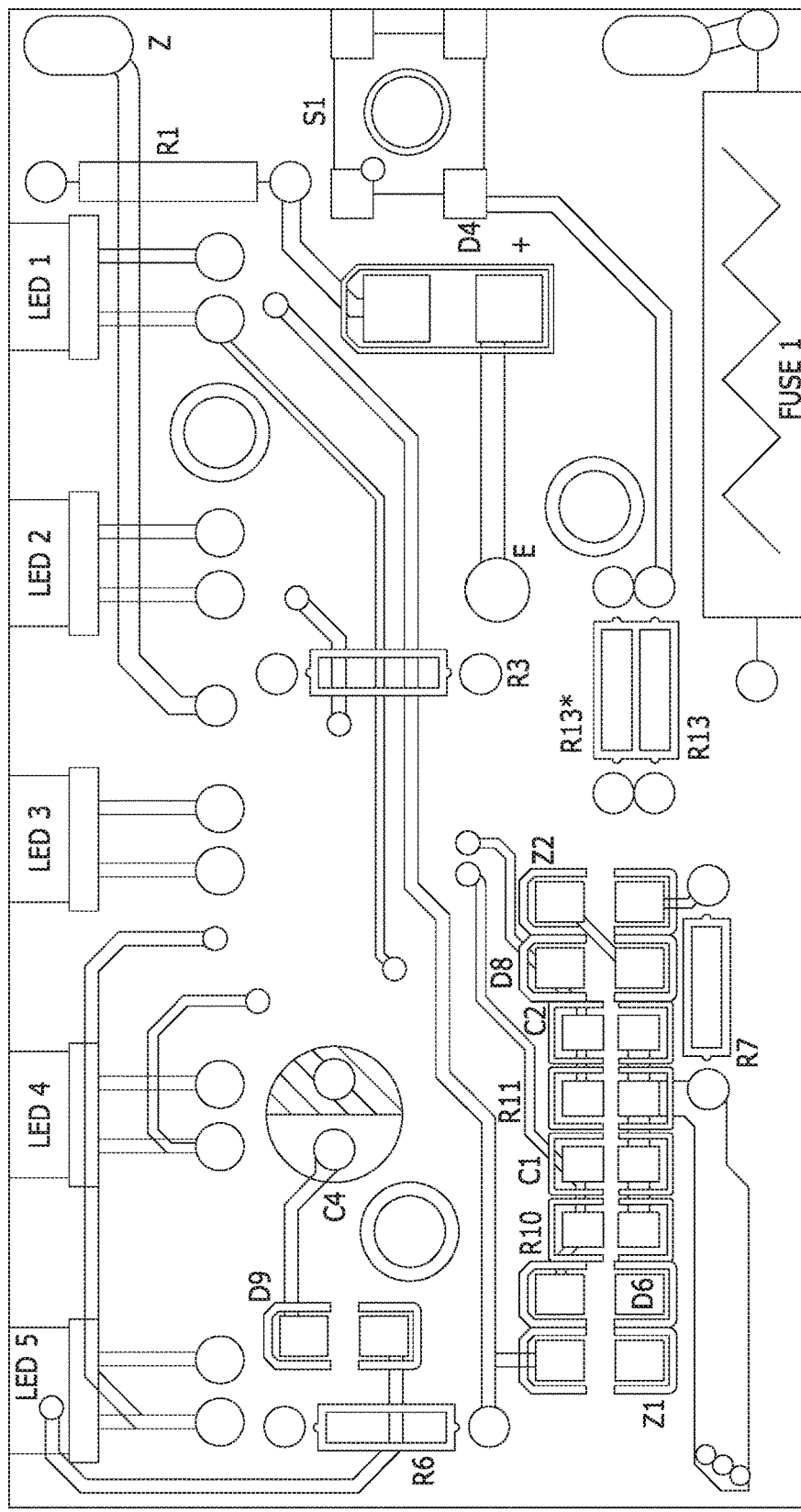
FIGS. 68-69 are schematic diagrams of a printed circuit board of a receptacle tester.
Figure 69:
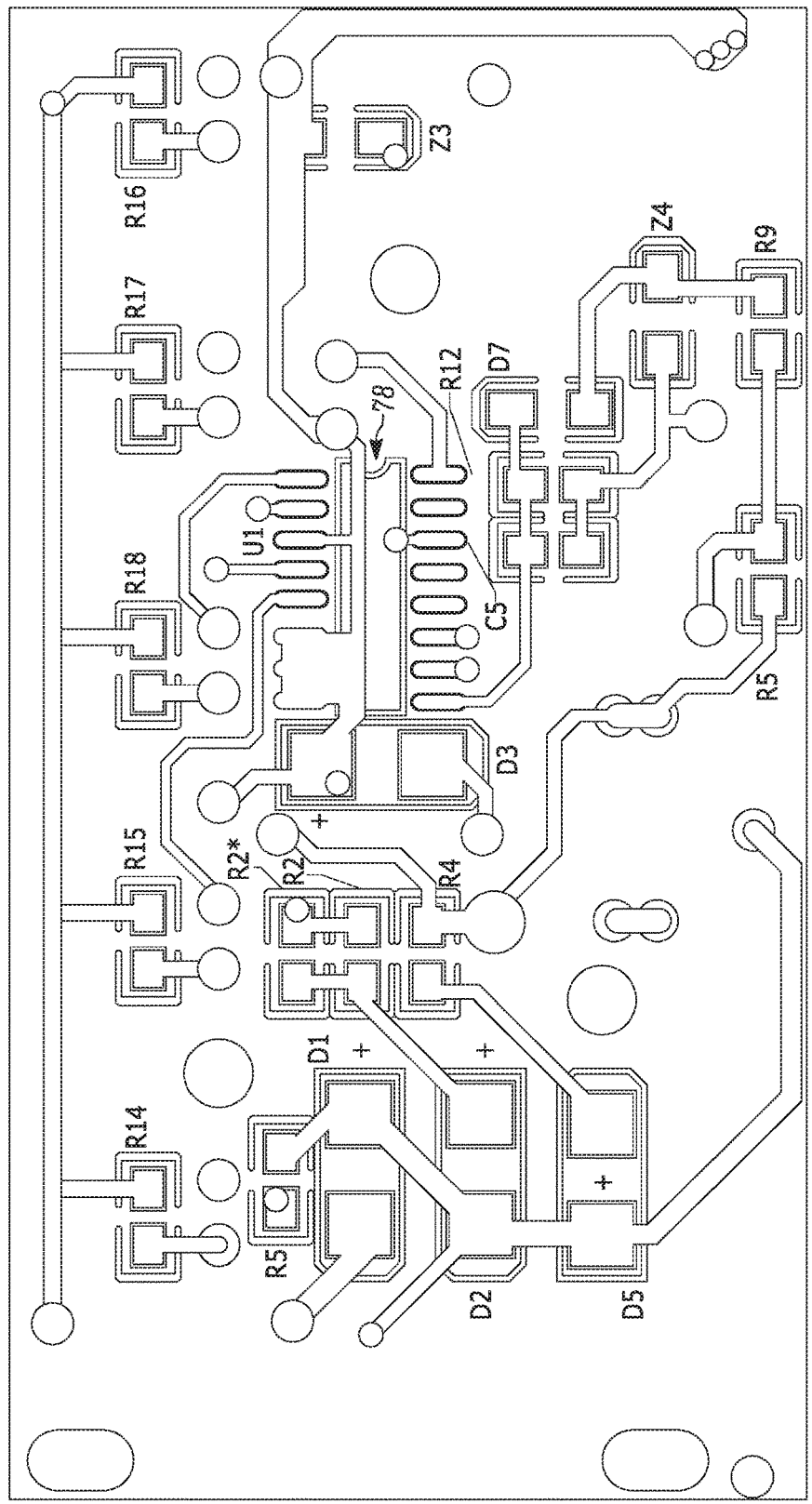

As shown in FIGS. 58-61, the tester 26A includes a printed circuit board (PCB) 42 (shown in more detail in FIGS. 68-69) electrically connected to the receptacle contacts 28A, 30A, 32A and, in the illustrated construction, a GCFI test circuit 46 including a switch 50. The GFCI test function is provided to test outlets wired in parallel to GFCI circuits (e.g., outlets for use in bathrooms, kitchens, outdoors, etc. which may require GFCI protection).

Figure 65:
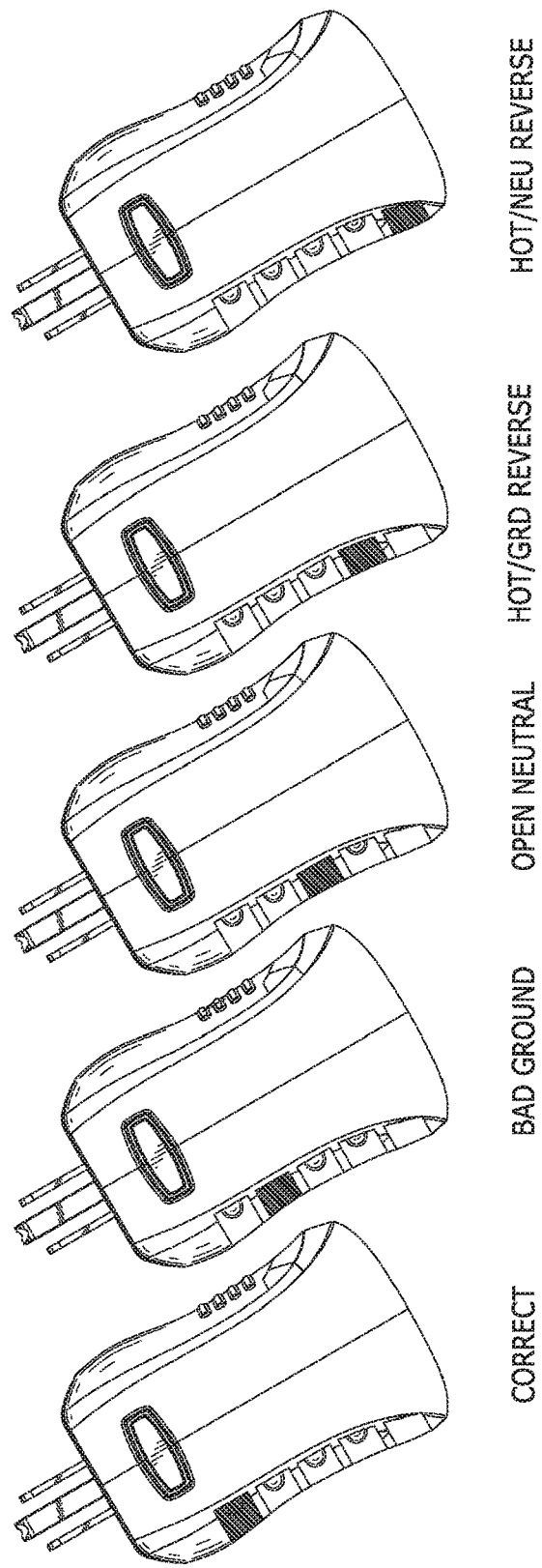
FIG. 65 includes perspective views of a receptacle tester illustrating an indicator of the wiring status of a tested outlet.

A number of indicators (e.g., light-emitting diodes (LEDs) 54, 56, 58, 60, 62) are electrically connected to the PCB 42. As described above, each LED 54-62 provides an indication of an associated wiring condition (see, e.g., FIG. 65) of a tested outlet (not shown). The tester 26A includes a lens 66 for each LED 54-62. The lenses 66 facilitate visibility of the LEDs 54-62 from multiple sides of the tester 26A. In the illustrated construction, the LEDs 54-62 are visible from three sides (e.g., the top, the bottom and one side) of the tester 26A to accommodate use of the tester 26A to test outlets of various standard and non-standard orientations.

In the illustrated construction, one LED 54 is a first color (e.g., green) to clearly indicate a first condition ("CORRECT"), and other LEDs 56-62 are a different color (e.g., red) to clearly indicate a different condition (e.g., an error condition). In other constructions (not shown), in addition or as an alternative to colored LEDs, the tester 26A may include one lens (not shown) of a first color to indicate the first condition, and other lenses (not shown) of a different color to indicate the different condition(s).

Figure 62:
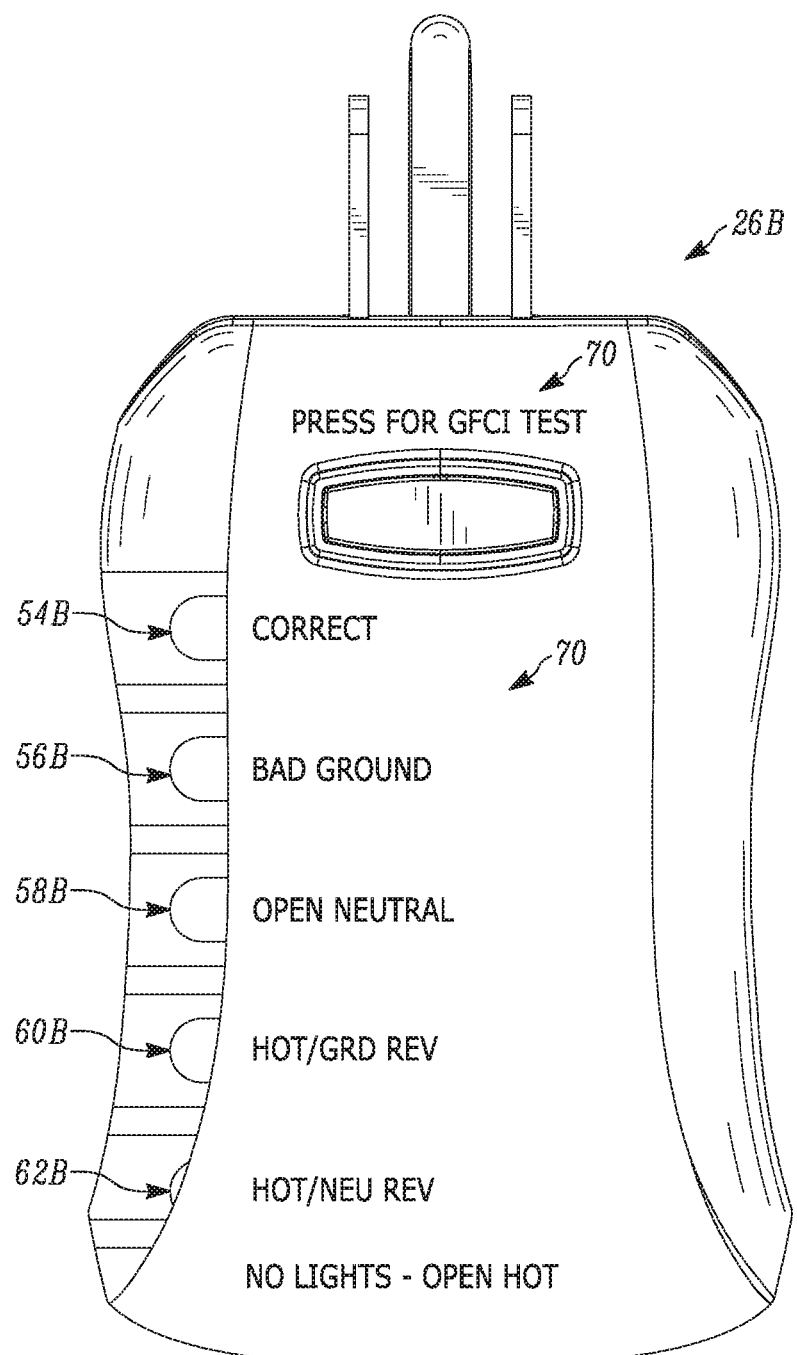
FIGS. 62-64 are views of yet another embodiment of a receptacle tester.
Figure 63:
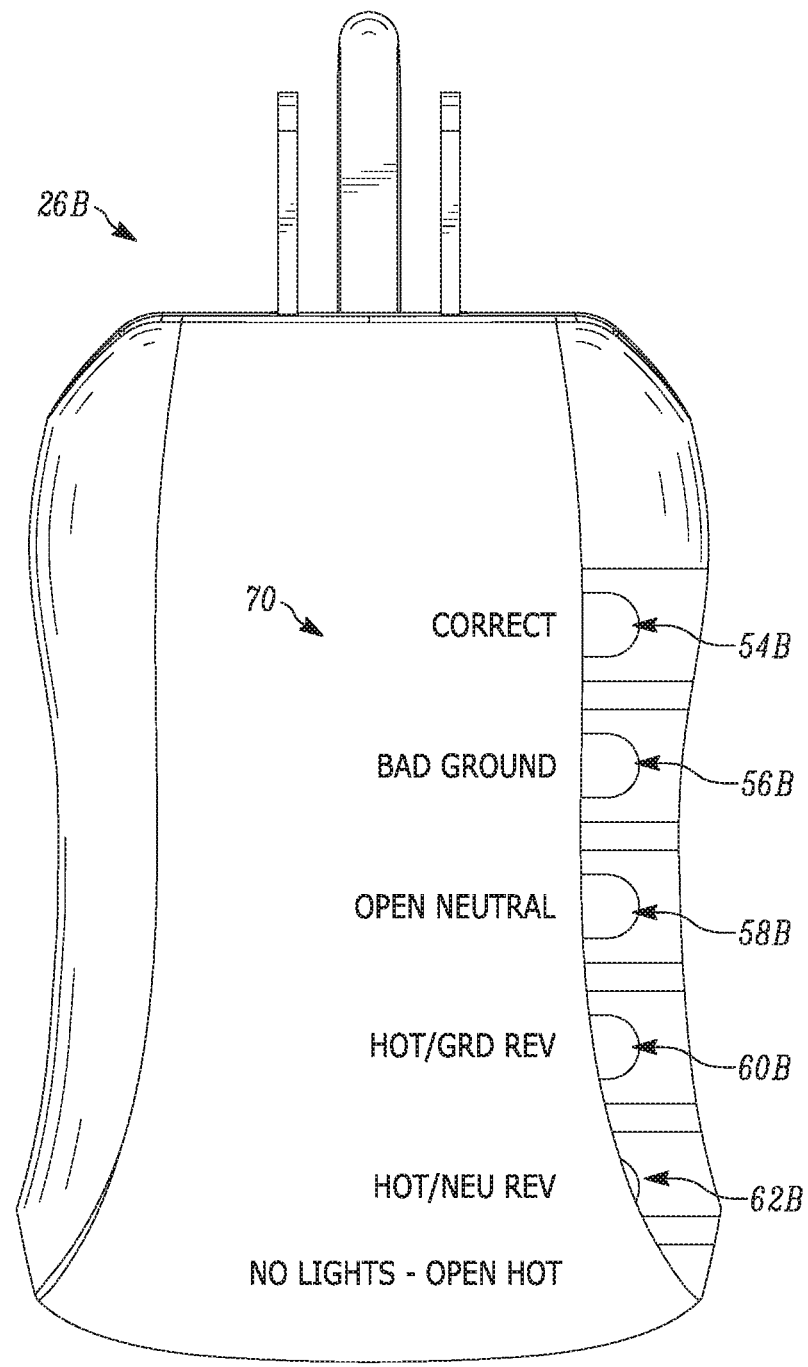
Figure 64:
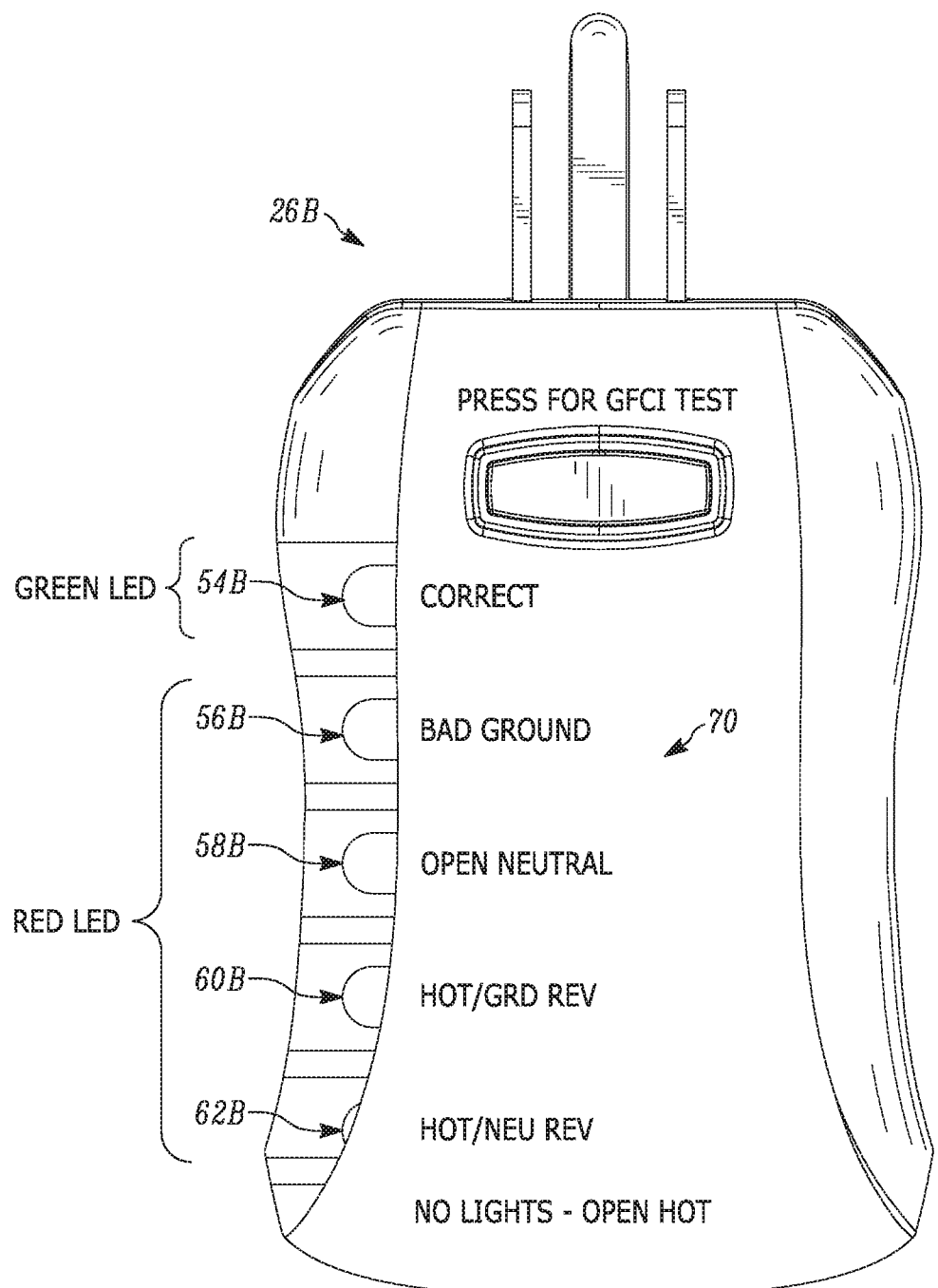

FIGS. 62-64 illustrate an alternative construction of a receptacle tester 26B. The tester 26B is similar to the tester 26, 26A described above, and common elements have the same reference number "B".

The tester 26B includes markings 70 associated with the indicators (LEDs 54B-62B). In the illustrated construction, the markings 70 include characters (e.g., words, abbreviations, acronyms, etc.) representative of the associated circuit condition. In the illustrated construction, the markings 70 are provided on opposite large surfaces (e.g., top and bottom) of the tester 26B.

Figure 66:
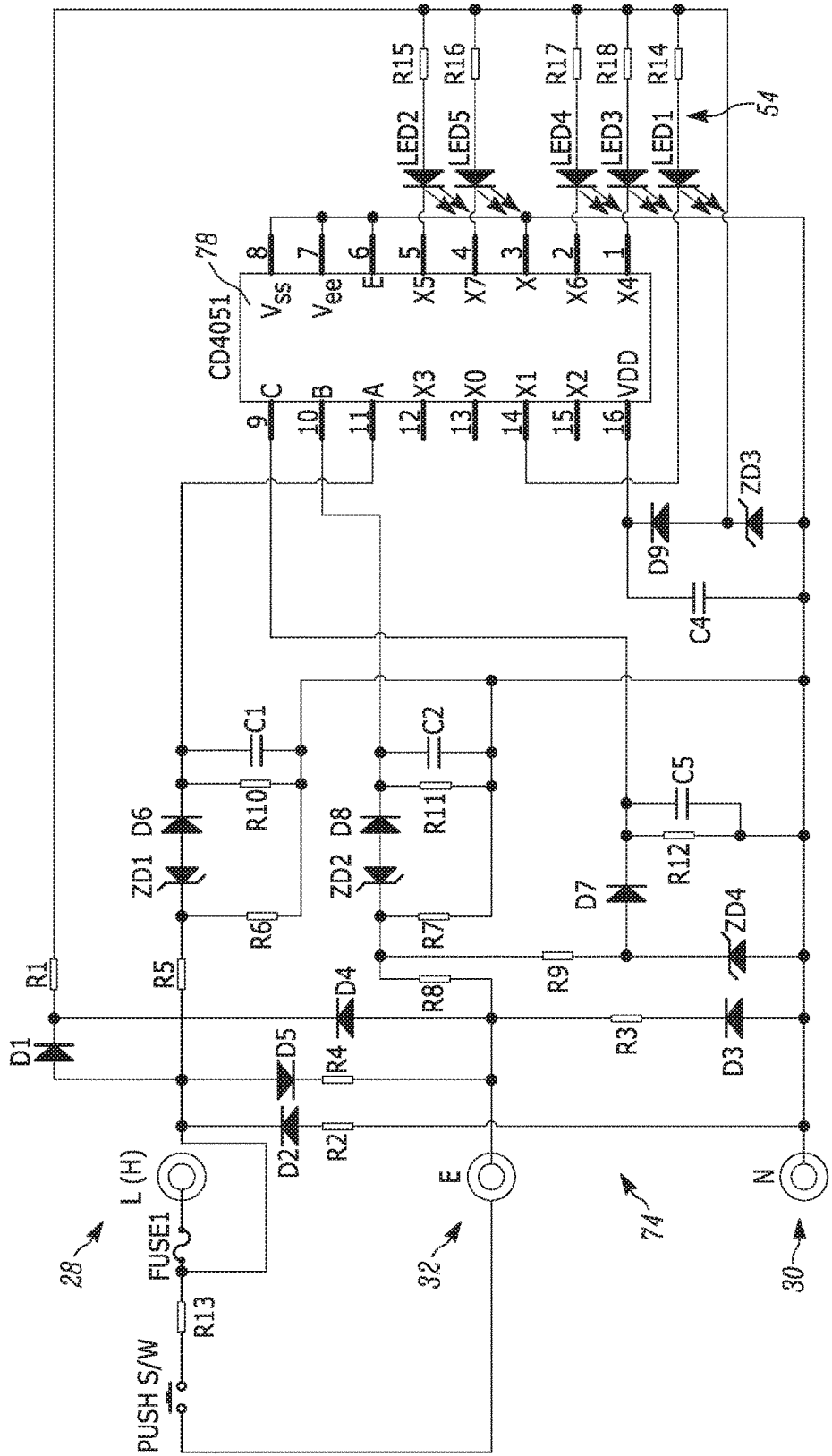
FIG. 66 is a schematic diagram of an electrical circuit of a receptacle tester.
Figure 67:
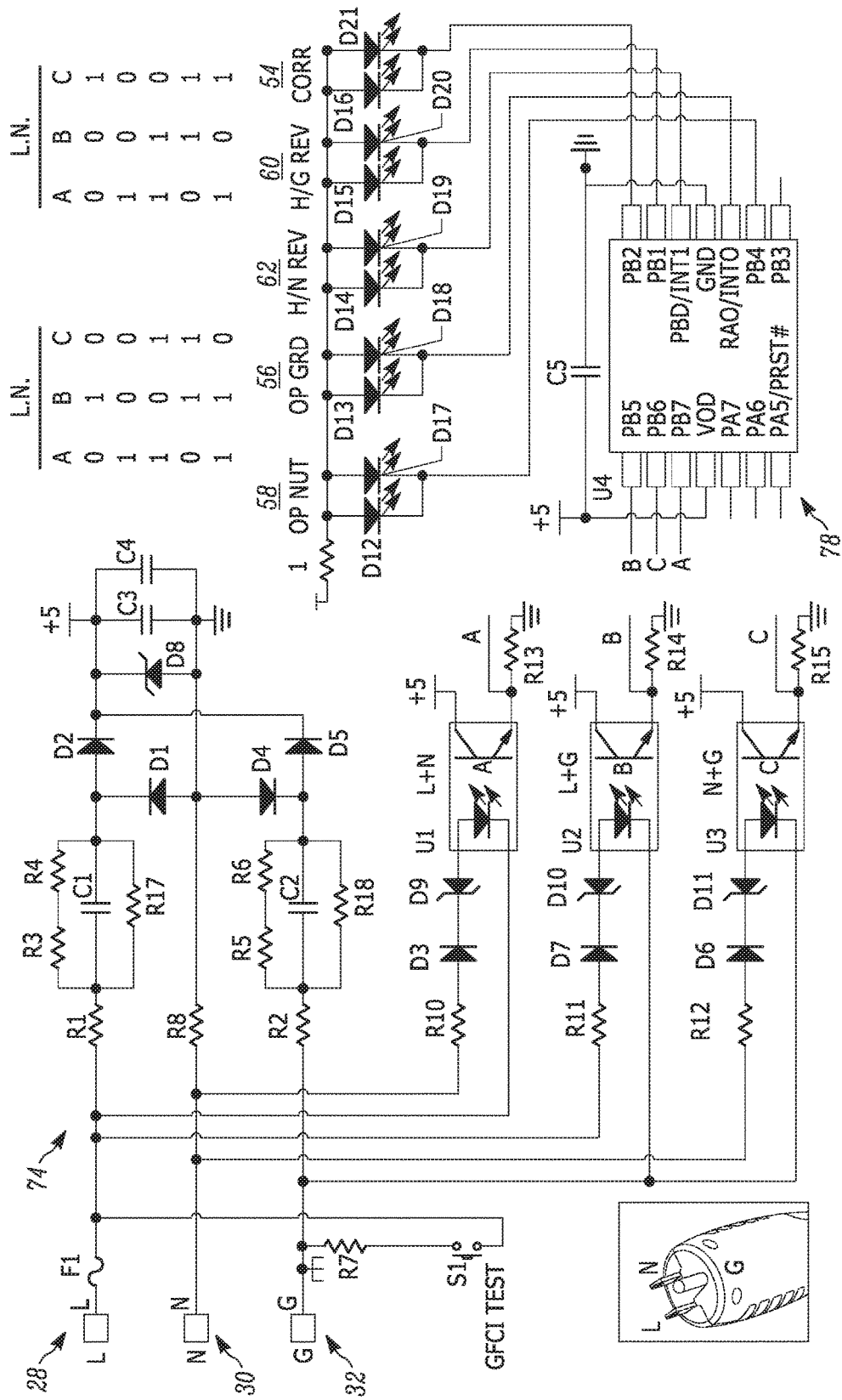
FIG. 67 is a schematic diagram of an alternative construction of an electrical circuit of a receptacle tester.

FIGS. 66-67 illustrate exemplary circuitry 74 of the tester 26, 26A, 26B. The illustrated circuitry 74 includes a controller 78 operable to execute a program to perform functionality such as, for example, analyze the circuit connection of the outlet to be tested, analyze the ground circuit, etc.

The circuitry 74 includes components to test the wiring of the outlet. The components communicate with the controller 78, and the controller 78 is operable to determine the condition of the outlet. The controller 78 is operable to control the indicators (LEDs 54-62) to indicate the condition of the outlet to the user.

In the illustrated construction, power for the circuitry 74 including the controller 70 is provided by the outlet to be tested. A small current is applied in the circuitry 74 to analyze the resistance of the ground circuit to determine a low resistance value (e.g., 10 ohms or less).

The controller 78 includes combinations of hardware and software that are operable to, among other things, configure and control operation of the tester 26, 26A, 26B. The controller 78 includes a processing unit (e.g., a microprocessor, a microcontroller, or another suitable programmable device), non-transitory computer-readable media, and an input/output interface. The processing unit, the media, and the input/output interface are connected by one or more control and/or data buses. The computer-readable media stores program instructions and data. The processing unit is configured to retrieve instructions from the media and execute the instructions to perform the control processes and methods described herein.

The input/output interface transmits data from the controller 78 to external systems, networks, and/or devices and receives data from external systems, networks, and/or devices. The input/output interface stores data received from external sources to the media and/or provides the data to the processing unit.

Many of the modules and logical structures described are capable of being implemented in software executed by a microprocessor or a similar device or of being implemented in hardware using a variety of components including, for example, application specific integrated circuits ("ASICs"). Terms like "controller" and "module" may include or refer to both hardware and/or software. Capitalized terms conform to common practices and help correlate the description with the coding examples, equations, and/or drawings. However, no specific meaning is implied or should be inferred simply due to the use of capitalization. Thus, the claims should not be limited to the specific examples or terminology or to any specific hardware or software implementation or combination of software or hardware.

Unlike "neon bulb" receptacle testers, the tester 26, 26A, 26B can detect low resistance values on the ground circuit. In addition, the tester 26, 26A, 26B provides a single indicator (LED) readout without the need to read or memorize a chart to interpret multiple indicators.

Thus, the invention may generally provide, among other things, a receptacle tester including a controller and a number of indicators (e.g., light-emitting diodes (LEDs)) electrically connected to the controller, each indicator being representative of a condition of wiring of an outlet to be tested, each indicator being visible from at least two opposite sides of the housing.

Preferred embodiments of the invention have been described in considerable detail. Many modifications and variations to the preferred embodiments described will be apparent to a person of ordinary skill in the art. Therefore, the invention should not be limited to the embodiments described.

One or more independent features and independent advantages of the invention may be set forth in the claims.

What is claimed is:

1. A single line codeless receptacle tester comprising:
   a single line outlet tester circuitry configured to perform a plurality of electrical outlet testing functions; and
   a housing having
      a first end,
      a second end opposite the first end, and
      an enclosure that encloses the single line outlet tester circuitry, and
      an indicator section including five codeless wiring condition indicators and five dedicated light sources that are electrically connected to the single line outlet tester circuitry,
   wherein each codeless wiring condition indicator of the five codeless wiring condition indicators is indicative of only one wiring condition of a plurality of wiring conditions of a single line electrical outlet,
   wherein the each codeless wiring condition indicator corresponds to only a respective one of the five dedicated light sources,
   wherein the single line outlet tester circuitry is configured to control a first dedicated light source of the five dedicated light sources to emit light based on the plurality of electrical outlet testing functions, the emission of light by the first dedicated light source being dedicated to a first codeless wiring condition indicator of the five codeless wiring condition indicators, and
   wherein the single line outlet tester circuitry is configured to control the five dedicated light sources to not emit light based on the plurality of electrical outlet testing functions, a lack of emission of light by the five dedicated light sources being dedicated to a first wiring condition indicator, wherein the first wiring condition indicator is different from the first codeless wiring condition indicator.

2. The single line codeless receptacle tester of claim 1, wherein the single line outlet tester circuitry further includes a ground-fault-circuit-interrupter (GFCI) test circuit that is configured to test a ground-fault-circuit-interrupter (GFCI) circuit in parallel to the single line electrical outlet.

3. The single line codeless receptacle tester of claim 1, further comprising a male plug electrically coupled to the single line outlet tester circuitry.

4. The single line codeless receptacle tester of claim 3, wherein the male plug includes two flat blades and a round prong.

5. The single line codeless receptacle tester of claim 1, wherein the single line outlet tester circuitry includes a controller configured to perform the plurality of electrical outlet testing functions, wherein the plurality of electrical outlet testing functions includes analyzing a circuit connection of the single line electrical outlet.

6. The single line codeless receptacle tester of claim 5, wherein the plurality of electrical outlet testing functions includes analyzing a ground circuit of the single line electrical outlet.

7. The single line codeless receptacle tester of claim 6, wherein the controller is configured to apply a current to analyze a resistance of the ground circuit of the single line electrical outlet and determine whether the single line electrical outlet has a low resistance value based on the current.

8. The single line codeless receptacle tester of claim 7, wherein the low resistance value is equal to or less than ten ohms.

9. The single line codeless receptacle tester of claim 1, wherein each dedicated light source of the five dedicated light sources has a lens and a light source, wherein the lens is configured to transparently cover and mechanically protect the light source.

10. The single line codeless receptacle tester of claim 9, wherein the each dedicated light source of the five dedicated light sources includes one or more light-emitting diodes (LEDs), and wherein the lens is a light pipe.

11. The single line codeless receptacle tester of claim 10, wherein the each codeless wiring condition indicator of the five codeless wiring condition indicators includes codeless markings disposed on the housing, the codeless markings selected from a group consisting of:
Correct,
Bad ground,
Open neutral,
Hot/Grd rev, and
Hot/Neu rev.

12. The single line codeless receptacle tester of claim 11, wherein the one or more LEDs of the first dedicated light source are associated with the Correct codeless marking, and wherein a combination of an illumination of the one or more LEDs of the first dedicated light source and the Correct codeless marking provides a first codeless indication that the one wiring condition of the single line electrical outlet is a Correct wiring condition.

13. The single line codeless receptacle tester of claim 1, wherein the single line outlet tester circuitry is configured to control a second dedicated light source of the five dedicated light sources to emit light based on the plurality of electrical outlet testing functions, the emission of light by the second dedicated light source being dedicated to a second codeless wiring condition indicator of the five codeless wiring condition indicators, wherein the second dedicated light source is different from the first dedicated light source, and wherein the second codeless wiring condition indicator is different from the first codeless wiring condition indicator and the first wiring condition indicator.

14. The single line codeless receptacle tester of claim 13, wherein the single line outlet tester circuitry is configured to control a third dedicated light source of the five dedicated light sources to emit light based on the plurality of electrical outlet testing functions, the emission of light by the third dedicated light source being dedicated to a third codeless wiring condition indicator of the five codeless wiring condition indicators, wherein the third dedicated light source is different from the first dedicated light source and the second dedicated light source, and wherein the third codeless wiring condition indicator is different from the first codeless wiring condition indicator, the first wiring condition indicator, and the second codeless wiring condition indicator.

15. The single line codeless receptacle tester of claim 14, wherein the single line outlet tester circuitry is configured to control a fourth dedicated light source of the five dedicated light sources to emit light based on the plurality of electrical outlet testing functions, the emission of light by the fourth dedicated light source being dedicated to a fourth codeless wiring condition indicator of the five codeless wiring condition indicators, wherein the fourth dedicated light source is different from the first dedicated light source, the second dedicated light source, and the third dedicated light source, and wherein the fourth codeless wiring condition indicator is different from the first codeless wiring condition indicator, the first wiring condition indicator, the second codeless wiring condition indicator, and the third codeless wiring condition indicator.

16. The single line codeless receptacle tester of claim 15, wherein the single line outlet tester circuitry is configured to control a fifth dedicated light source of the five dedicated light sources to emit light based on the plurality of electrical outlet testing functions, the emission of light by the fifth dedicated light source being dedicated to a fifth codeless wiring condition indicator of the five codeless wiring condition indicators, wherein the fifth dedicated light source is different from the first dedicated light source, the second dedicated light source, the third dedicated light source, and the fourth dedicated light source, and wherein the fifth codeless wiring condition indicator is different from the first codeless wiring condition indicator, the first wiring condition indicator, the second codeless wiring condition indicator, the third codeless wiring condition indicator, and the fourth codeless wiring condition indicator.

17. A single line codeless receptacle tester comprising:
a single line outlet tester circuitry configured to perform a plurality of electrical outlet testing functions; and
a housing having
a first end,
a second end opposite the first end, and
an enclosure that encloses the single line outlet tester circuitry, and
an indicator section including a plurality of wiring condition indicators and a plurality of dedicated light sources, the plurality of dedicated light sources is electrically connected to the single line outlet tester circuitry,
wherein the single line outlet tester circuitry is configured to control the plurality of dedicated light sources to provide a plurality of codeless indications, each codeless indication of the plurality of codeless indications is indicative of only one wiring condition of a plurality of wiring conditions of a single line electrical outlet,
wherein, to provide a first codeless indication of the plurality of codeless indications, the single line outlet tester circuitry is configured to control a first dedicated light source of the plurality of dedicated light sources to emit light based on the plurality of electrical outlet testing functions, the emission of light by the first dedicated light source being dedicated to a first wiring condition indicator of the plurality of wiring condition indicators, and
wherein, to provide a second codeless indication of the plurality of codeless indications, the single line outlet tester circuitry is configured to control the plurality of dedicated light sources to not emit light based on the plurality of electrical outlet testing functions, a lack of emission of light by the plurality of dedicated light sources being dedicated to a second wiring condition indicator of the plurality of wiring condition indicators, wherein the second wiring condition indicator is different from the first wiring condition indicator,
wherein, to provide a third codeless indication of the plurality of codeless indications, the single line outlet tester circuitry is configured to control a second dedicated light source of the plurality of dedicated light sources to emit light based on the plurality of electrical outlet testing functions, the emission of light by the second dedicated light source being dedicated to a third wiring condition indicator of the plurality of wiring condition indicators, wherein the second dedicated light source is different from the first dedicated light source, and wherein the third wiring condition indicator is different from the first wiring condition indicator and the second wiring condition indicator,
wherein, to provide a fourth codeless indication of the plurality of codeless indications, the single line outlet tester circuitry is configured to control a third dedicated light source of the plurality of dedicated light sources to emit light based on the plurality of electrical outlet testing functions, the emission of light by the third dedicated light source being dedicated to a fourth wiring condition indicator of the plurality of wiring condition indicators, wherein the third dedicated light source is different from the first dedicated light source and the second dedicated light source, and wherein the fourth wiring condition indicator is different from the first wiring condition indicator, the second wiring condition indicator, and the third wiring condition indicator, wherein, to provide a fifth codeless indication of the plurality of codeless indications, the single line outlet tester circuitry is configured to control a fourth dedicated light source of the plurality of dedicated light sources to emit light based on the plurality of electrical outlet testing functions, the emission of light by the fourth dedicated light source being dedicated to a fifth wiring condition indicator of the plurality of wiring condition indicators, wherein the fourth dedicated light source is different from the first dedicated light source, the second dedicated light source, and the third dedicated light source, and wherein the fifth wiring condition indicator is different from the first wiring condition indicator, the second wiring condition indicator, the third wiring condition indicator, and the fourth wiring condition indicator, wherein, to provide a sixth codeless indication of the plurality of codeless indications, the single line outlet tester circuitry is configured to control a fifth dedicated light source of the plurality of dedicated light sources to emit light based on the plurality of electrical outlet testing functions, the emission of light by the fifth dedicated light source being dedicated to a sixth wiring condition indicator of the plurality of wiring condition indicators, wherein the fifth dedicated light source is different from the first dedicated light source, the second dedicated light source, the third dedicated light source, and the fourth dedicated light source, and wherein the sixth wiring condition indicator is different from the first wiring condition indicator, the second wiring condition indicator, the third wiring condition indicator, the fourth wiring condition indicator, and the fifth wiring condition indicator, and wherein the first wiring condition indicator is indicative of a Correct wiring condition of the single line electrical outlet, wherein the second wiring condition indicator is indicative of an Open Hot wiring condition of the single line electrical outlet, wherein the third wiring condition indicator is indicative of a Bad ground wiring condition of the single line electrical outlet, wherein the fourth wiring condition indicator is indicative of an Open neutral wiring condition of the single line electrical outlet, wherein the fifth wiring condition indicator is indicative of a Hot/Grd rev wiring condition of the single line electrical outlet, and wherein the sixth wiring condition indicator is indicative of a Hot/Neu rev wiring condition of the single line electrical outlet.

18. A single line codeless receptacle tester comprising:
a single line outlet tester circuitry configured to perform a plurality of electrical outlet testing functions; and
a housing having
  a first end,
  a second end opposite the first end, and
  an enclosure that encloses the single line outlet tester circuitry, and
  an indicator section including three or more codeless wiring condition indicators and three or more dedicated light sources that are electrically connected to the single line outlet tester circuitry, wherein each codeless wiring condition indicator of the three or more codeless wiring condition indicators is indicative of only one wiring condition of a plurality of wiring conditions of a single line electrical outlet, wherein the each codeless wiring condition indicator corresponds to only a respective one of the three or more dedicated light sources, wherein the single line outlet tester circuitry is configured to control a first dedicated light source of the three or more dedicated light sources to emit light based on the plurality of electrical outlet testing functions, the emission of light by the first dedicated light source being dedicated to a first codeless wiring condition indicator of the three or more codeless wiring condition indicators, and wherein the single line outlet tester circuitry is configured to control the three or more dedicated light sources to not emit light based on the plurality of electrical outlet testing functions, a lack of emission of light by the three or more dedicated light sources being dedicated to a first wiring condition indicator, wherein the first wiring condition indicator is different from the first codeless wiring condition indicator, wherein the single line outlet tester circuitry is configured to control a second dedicated light source of the three or more dedicated light sources to emit light based on the plurality of electrical outlet testing functions, the emission of light by the second dedicated light source being dedicated to a second codeless wiring condition indicator of the three or more codeless wiring condition indicators, wherein the second dedicated light source is different from the first dedicated light source, and wherein the second codeless wiring condition indicator is different from the first codeless wiring condition indicator and the first wiring condition indicator, wherein the single line outlet tester circuitry is configured to control a third dedicated light source of the three or more dedicated light sources to emit light based on the plurality of electrical outlet testing functions, the emission of light by the third dedicated light source being dedicated to a third codeless wiring condition indicator of the three or more codeless wiring condition indicators, wherein the third dedicated light source is different from the first dedicated light source and the second dedicated light source, and wherein the third codeless wiring condition indicator is different from the first codeless wiring condition indicator, the first wiring condition indicator, and the second codeless wiring condition indicator, wherein the single line outlet tester circuitry is configured to control a fourth dedicated light source of the three or more dedicated light sources to emit light based on the plurality of electrical outlet testing functions, the emission of light by the fourth dedicated light source being dedicated to a fourth codeless wiring condition indicator of the three or more codeless wiring condition indicators, wherein the fourth dedicated light source is different from the first dedicated light source, the second dedicated light source, and the third dedicated light source, and wherein the fourth codeless wiring condition indicator is different from the first codeless wiring condition indicator, the first wiring condition indicator, the second codeless wiring condition indicator, and the third codeless wiring condition indicator, wherein the single line outlet tester circuitry is configured to control a fifth dedicated light source of the three or more dedicated light sources to emit light based on the plurality of electrical outlet testing functions, the emission of light by the fifth dedicated light source being dedicated to a fifth codeless wiring condition indicator of the three or more codeless wiring condition indicators, wherein the fifth dedicated light source is different from the first dedicated light source, the second dedicated light source, the third dedicated light source, and the fourth dedicated light source, and wherein the fifth codeless wiring condition indicator is different from the first codeless wiring condition indicator, the first wiring condition indicator, the second codeless wiring condition indicator, the third codeless wiring condition indicator, and the fourth codeless wiring condition indicator, and wherein the first codeless wiring condition indicator is indicative of a Correct wiring condition of the single line electrical outlet, wherein the first wiring condition indicator is indicative of an Open Hot wiring condition of the single line electrical outlet, wherein the second codeless wiring condition indicator is indicative of a Bad ground wiring condition of the single line electrical outlet, wherein the third codeless wiring condition indicator is indicative of an Open neutral wiring condition of the single line electrical outlet, wherein the fourth codeless wiring condition indicator is indicative of a Hot/Grd rev wiring condition of the single line electrical outlet, and wherein the fifth codeless wiring condition indicator is indicative of a Hot/Neu rev wiring condition of the single line electrical outlet.

* * * * *